(12) United States Patent
Tiwari et al.

(10) Patent No.: US 8,987,701 B2
(45) Date of Patent: Mar. 24, 2015

(54) PHASE TRANSITION MEMORIES AND TRANSISTORS

(75) Inventors: Sandip Tiwari, Ithaca, NY (US); Ravishankar Sundararaman, Ithaca, NY (US); Sang Hyeon Lee, Ithaca, NY (US); Moonkyung Kim, Ithaca, NY (US)

(73) Assignee: Cornell University, Ithaca, NY (US)

( * ) Notice: Subject to any disclaimer, the term of this patent is extended or adjusted under 35 U.S.C. 154(b) by 27 days.

(21) Appl. No.: 13/322,379

(22) PCT Filed: May 28, 2010

(86) PCT No.: PCT/US2010/036667
§ 371 (c)(1),
(2), (4) Date: Mar. 6, 2012

(87) PCT Pub. No.: WO2010/138876
PCT Pub. Date: Dec. 2, 2010

(65) Prior Publication Data
US 2012/0280301 A1    Nov. 8, 2012

Related U.S. Application Data

(60) Provisional application No. 61/181,966, filed on May 28, 2009.

(51) Int. Cl.
*H01L 47/00*     (2006.01)
*H01L 29/68*     (2006.01)
*H01L 29/51*     (2006.01)

(52) U.S. Cl.
CPC .............. *H01L 29/685* (2013.01); *H01L 29/51* (2013.01); *H01L 29/513* (2013.01); *H01L 29/517* (2013.01)
USPC ................ 257/4; 257/315; 365/184; 438/257

(58) Field of Classification Search
CPC ... H01L 29/685; H01L 45/06; G11C 13/0004
USPC ................ 257/315, E21.422, E29.3; 438/257
See application file for complete search history.

(56) References Cited

U.S. PATENT DOCUMENTS 5,912,839 A      6/1999   Ovshinsky et al.
6,426,891 B1 *   7/2002   Katori ........................... 365/175
(Continued)

FOREIGN PATENT DOCUMENTS

CN      1819059         8/2008
JP      2006/221737     8/2006
(Continued)

OTHER PUBLICATIONS

Patent Cooperation Treaty, International Search Report and Written Opinion, International Application No. PCT/US2010/036667, dated Dec. 21, 2010 (9 pages).
(Continued)

*Primary Examiner* — Thao X Le
*Assistant Examiner* — Gardner W Swan
(74) *Attorney, Agent, or Firm* — Heslin Rothenberg Farley & Mesiti P.C.; George S. Blasiak, Esq.

(57) ABSTRACT

In one embodiment there is set forth a method comprising providing a semiconductor structure having an electrode, wherein the providing includes providing a phase transition material region and wherein the method further includes imparting energy to the phase transition material region to induce a phase transition of the phase transition material region. By inducing a phase transition of the phase transition material region, a state of the semiconductor structure can be changed. There is further set forth an apparatus comprising a structure including an electrode and a phase transition material region, wherein the apparatus is operative for imparting energy to the phase transition material region to induce a phase transition of the phase transition material region without the phase transition of the phase transition material region being dependent on electron transport through the phase transition material region.

42 Claims, 21 Drawing Sheets

(56) References Cited

U.S. PATENT DOCUMENTS

| | | |
|---|---|---|
| 6,872,972 B2 | 3/2005 | Huang et al. |
| 6,985,377 B2 | 1/2006 | Rust |
| 7,365,355 B2 * | 4/2008 | Parkinson ............... 257/3 |
| 7,443,721 B2 | 10/2008 | Kurotuchi et al. |
| 7,534,625 B2 | 5/2009 | Karpov et al. |
| 7,649,191 B2 | 1/2010 | Czubatyj et al. |
| 7,660,165 B2 | 2/2010 | Ohsawa |
| 7,667,998 B2 | 2/2010 | Jeong et al. |
| 7,847,329 B2 * | 12/2010 | Pellizzer et al. .......... 257/302 |
| 7,911,928 B2 * | 3/2011 | Hong et al. ............... 369/126 |
| 8,036,013 B2 * | 10/2011 | Lowrey et al. ............ 365/148 |
| 2006/0203542 A1 | 9/2006 | Kurotuchi et al. |
| 2007/0047303 A1 | 3/2007 | Kim |
| 2007/0292985 A1 | 12/2007 | Zhang |
| 2008/0067486 A1 | 3/2008 | Karpov et al. |
| 2008/0246076 A1 | 10/2008 | Chen |
| 2008/0248628 A1 | 10/2008 | Son et al. |
| 2009/0267046 A1 | 10/2009 | Mazoyer et al. |
| 2009/0296457 A1 * | 12/2009 | Suh ........................... 365/163 |
| 2010/0054015 A1 * | 3/2010 | Lee et al. .................. 365/148 |
| 2010/0072451 A1 | 3/2010 | Terao et al. |

FOREIGN PATENT DOCUMENTS

| | | | | |
|---|---|---|---|---|
| KR | 2006/0090744 | | 8/2006 | |
| KR | 2010/0694316 | | 3/2007 | |
| KR | 10-0744566 | * | 8/2007 | ........... H01L 27/115 |
| KR | 2010/0744566 | | 8/2007 | |
| KR | 10-0890212 | * | 3/2009 | ........... H01L 27/115 |
| KR | 2010/0890212 | | 3/2009 | |
| TW | 200703619 | | 1/2007 | |
| WO | WO 2008/120126 | | 10/2008 | |
| WO | WO 2010/138876 A2 | | 12/2010 | |

OTHER PUBLICATIONS

Proceedings of the IEEE International Conference, Kim et al, A New Single Element Phase Transition Memory, dated Aug. 20, 2010 (4 pages).

* cited by examiner

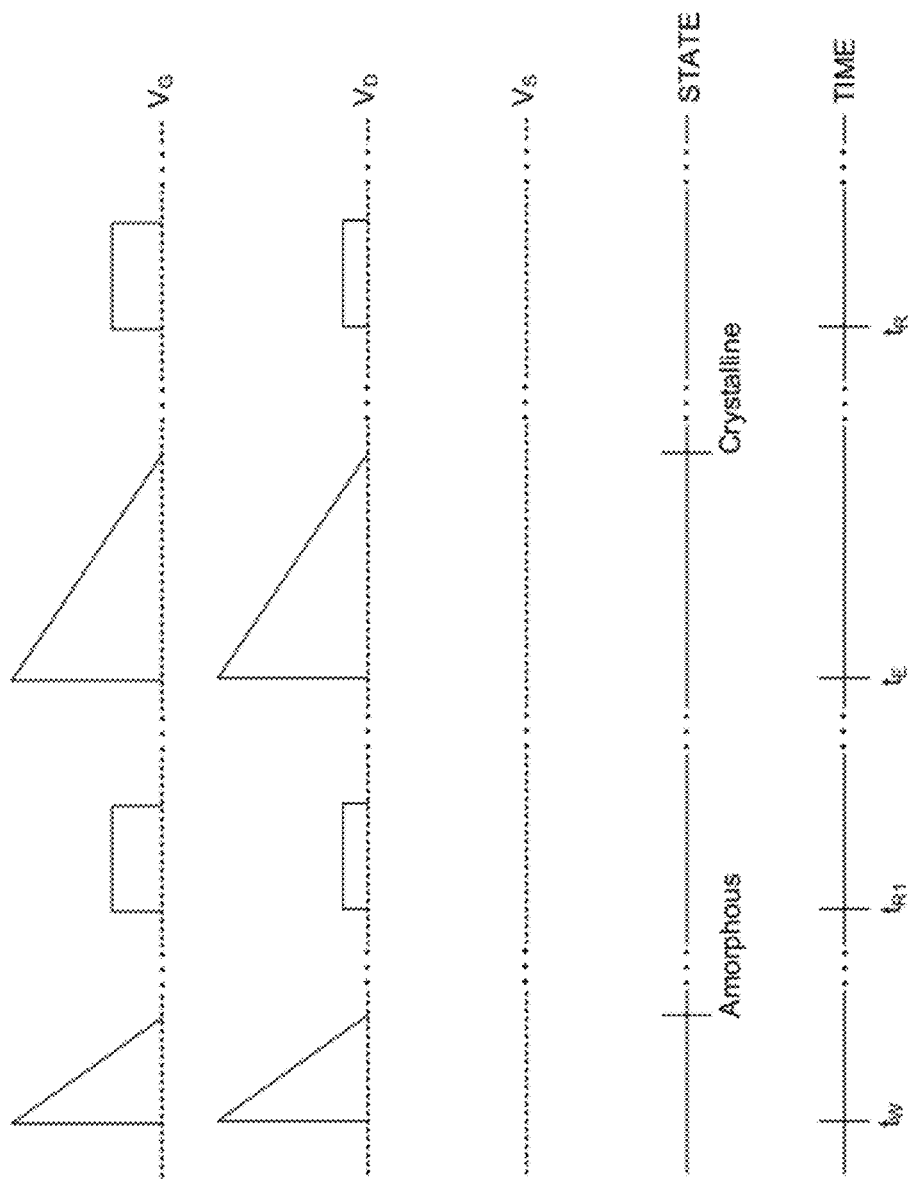

PHASE TRANSITION MEMORIES AND TRANSISTORS

CROSS REFERENCE TO RELATED APPLICATIONS

This application claims the priority of U. S. Provisional Patent Application No. 61/181,966 filed May 28, 2009 entitled "Phase Transition Memories and Transistors," which is incorporated herein by reference in its entirety.

STATEMENT REGARDING FEDERALLY SPONSORED RESEARCH OR DEVELOPMENT

The invention described herein was made under support from the National Science Foundation (Center for Nanoscale Systems) and Samsung Contract support through NATIONAL PROGRAM FOR TERA-LEVEL NANODEVICES (OSP Number: 46108/A001).

FIELD OF THE INVENTION

The present invention relates to materials and particularly to materials capable of phase transition.

BACKGROUND OF THE INVENTION

As dimensions decrease in electronics technology, among the major issues that arise are limits to power that can be extracted as dissipation occurs in smaller regions and the increasing variability in devices which depend on collective effects (the $\sqrt{n}$ effect). Decreasing size and increasing density permits larger information capability in processing and in storage. Non-volatile memories are ubiquitous, in use in digital cameras, cell phones, music players, computers, and everywhere else where non-volatile retention with rapid reading is of interest. Non-volatile memories, if integrated with electronics and allowing fast and low power data and program transfer, would permit new methods of information processing that may require less power. Achieving lower power in digital processing is also of interest so that more information processing capability can be integrated in smaller regions.

Semiconductor non-volatile memories provide speeds which while slower than of SRAMs, are faster than possible through other means, e.g., magnetic disks. The most common forms of non-volatile memory are various manifestations of electrically erasable and programmable memory structures employing a floating gate region in which charge is stored. Many new manifestations of this structure use few electrons, single electron, and defects to lower the power and to allow scaling of dimensions to dimensions lower than those possible with continuous floating gate regions. Memories have also employed defects and storage on the back of a silicon channel, thus allowing simultaneous transistor and memory capabilities. In these structures, charge is injected into the storage region and its storage there changes the state of the device. The energy of the electrons can cause defects and limits the useful number of cycles that the memory can be applied in addition to the power dissipation of the process.

Digital logic relies on field-effect, i.e., transport of electrons between two electrodes (source and drain) under the influence of a field where the charge is also simultaneously controlled by application of a field through a third electrode (gate). The turn-on of this device from off-state (where a barrier is present between source and drain) to on-state (where conduction is field modulated) occurs by control of the barrier between source and drain during the quasi-off state. Higher energy electrons (those in the tail in energy) can overcome the barrier, so the turn-on process has an exponential dependence that is at best 60 mV/decade of change in current. This limits the lowest voltages that can be applied to the device before a collection of them malfunctions.

Charge transport, e.g., electron transport and rapid electromagnetic field changes lead to power dissipation. Electron transport into the floating gates and out lead to high energy electron mediated defect generation. Thus, both non-volatile memories and transistors, where electron transport is involved, whether in the channel region between source and drain, or in between gate and the channel, have limits in voltages, power, dimensions, and the number of times the states can be changed.

These phenomena limit the usefulness at small dimensions because of the use of collective effects related to the charge densities in the two-dimensional regions (the channel) that are decreasing in size and the number of carriers that one works with which in these cases are limited to some density of states available multiplied by volume or area.

Field-effect's major attribute is that until reaching its limit, the turn-on behavior of the device is immune to the length scale. Transistor's threshold voltage does not change with gate length until it reaches the limit of smaller dimension and variability become important.

Use of phenomena either independent or coupled to field-effect that can overcome the collective effect limit arising from charge or dopant statistics may allow further reduction in power and increase in usefulness of electronic devices.

One such phenomenon is phase transition, a collective effect in which an ensemble of atoms change in properties under the influence of field, temperature, etc. Ferroelectric, ferromagnetic, metal-insulator, . . . , are examples of such transitions. CDROMs and DVDs employ phase transition materials whose optical reflectance is changed. Ferroelectric memories employ phase transition materials whose polarity (electric polarization) is reversed. Ferromagnetic storage, such as in disk drives, employ polarity (magnetic polarization) for bit information storage.

SUMMARY OF THE INVENTION

In one embodiment there is set forth a method comprising providing a semiconductor structure having an electrode, wherein the providing includes providing a phase transition material region and wherein the method further includes imparting energy to the phase transition material region to induce a phase transition of the phase transition material region. By inducing a phase transition of the phase transition material region, a state of the semiconductor structure can be changed. There is further set forth herein an apparatus comprising a structure including an electrode and a phase transition material region, wherein the apparatus is operative for imparting energy to the phase transition material region to induce a phase transition in the phase transition material region without the phase transition of the phase transition material region being dependent on charge transport through the phase transition material region.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

FIGS. 7-9 are timing diagrams illustrating operation of a semi-conductor structure including a phase transition material region;

FIG. 12 illustrates that binding energy of V(2p) peaks vary from 515.5 eV (film surface) to 514.3 eV (inside of the film);

FIG. 13 illustrates that the ratio of V(2p) and O(1s) is around 1:2.1 and 1:3.3 in the middle/surface of the film relatively for an exemplary structure considered;

FIG. 14 illustrates that sheet resistance changes by $10^2$ Ohm/sq in the vicinity of 67° C.;

DETAILED DESCRIPTION OF THE INVENTION

There is set forth herein a method comprising providing a semiconductor structure having an electrode, wherein the providing includes providing a phase transition material region and wherein the method further includes imparting energy to the phase transition material region to induce a phase transition of the phase transition material region. The described method is useful for defining a memory.

Figure 1:
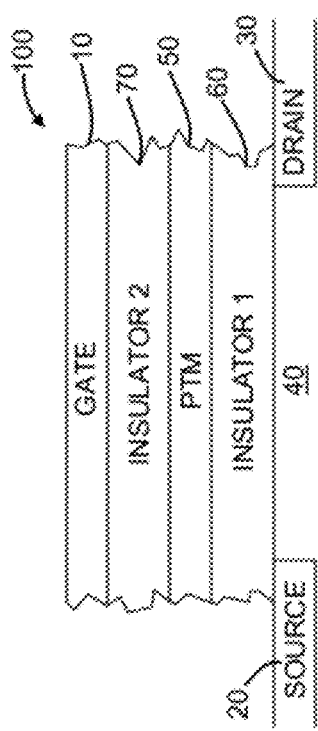
FIG. 1 is a schematic diagram of a semiconductor structure including a phase transition material region.

An exemplary semiconductor structure 100 is shown in FIG. 1. Structure 100 includes a gate 10, a source 20, a drain 30, and a channel 40 defined between the source 20 and drain 30. Gate 10, source 20, and drain 30 can be regarded as electrodes of structure 100. There can be disposed between the gate 10 and the channel 40 a phase transition material region 50. There can also be disposed between gate 10 and channel 40 insulators 60, 70 on either side of the phase transition material region (PTM region) 50. Optionally, one or more of insulators 60 and 70 can be deleted. In one embodiment, gate 10 can be provided by Ti/Al, and source 20 and drain 30 can be provide by $HfO_2$. Insulators 60, 70 can be provided by, e.g., $SiO_2$, $SiN_3N_4$, $Al2O_3$, $HfO_2$. PTM region 50 can be provided, in one embodiment, by an oxide, e.g., Vanadium oxide ($VO_2$), Chromium oxide ($Cr_2O_3$), Nickel oxide (NiO). PTM region 50, in another embodiment, can be provided by a complex oxide, e.g., LaSTO, LaCuO, STO, or Copper oxide, or other oxides that exhibit a phase transition under field. PTM region 50 can also be provided by a chalcogenide, e.g., GeSb, Germanium Antimony and Tellurium (GeSbTe) commonly known as "GST," GeSb with In, and in combinations classified as chalcogenides. Channel 40 can be provided by a semiconductor, e.g., Si, Ge, SiGe or a compound semiconductor.

Figure 2:
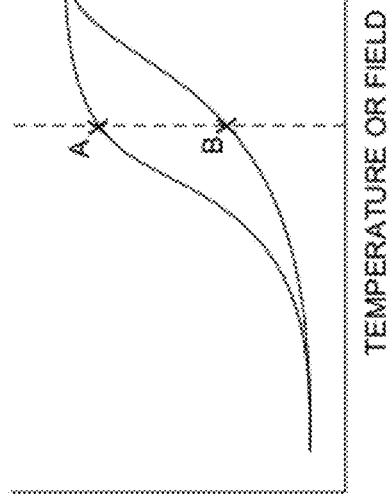
FIG. 2 illustrates conductivity characteristics of a semiconductor structure having multiple states.

An exemplary conductivity plot of the structure as shown in FIG. 1 is set forth in FIG. 2 wherein PTM region 50 is provided by a first certain material. Because a phase transition of PTM region 50 can be induced by impartation of energy, semiconductor structure 100 can exhibit a plurality of observable states; semiconductor structure 100 can include a first state when PTM region 50 is in a first phase and a second state when the PTM region 50 is in a second phase. A behavior of PTM region 50 can be changed when a phase transition of PTM region 50 is induced. A phase transition of PTM region 50 can result when energy is applied to PTM region 50. A phase transition of PTM region 50 can comprise, e.g., a transition between an insulative phase to a conductive phase, a change between an amorphous phase (at which PTM region 50 is more insulative, and which accordingly can be regarded as being in an insulative phase) and a crystalline phase (at which PTM region 50 is more conductive, and which accordingly can be regarded as being in a conductive phase). A higher conductivity is associated to a higher dielectric constant.

Figure 3:
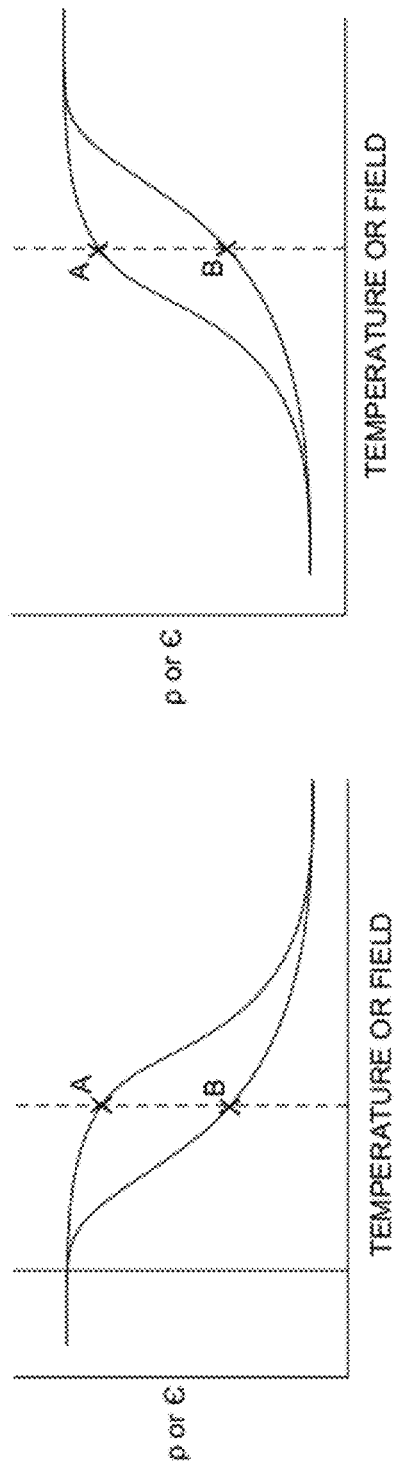
FIG. 3 illustrates conductivity characteristics of a semiconductor structure having multiple states.

Various methods can be employed for sensing a state of semiconductor structure 100. According to one method for sensing a state of semiconductor structure 100, a state of semiconductor structure 100 can be detected by detecting a conductivity of the structure 100. Behaviors of PTM region 50 other than conductivity, e.g., permittivity can change between phases of PTM region 50. Methods can be employed to sense a state of semiconductor structure 100 which do not involve detecting a conductivity of structure 100. For example, a state of semiconductor structure 100 can be sensed optically, e.g., by detecting a reflectivity of PTM region 50. Referring to conductivity plot (FIG. 3), conductivity plot of FIG. 3 illustrates states of structure 100 where PTM region 50 is provided by a different material, different than that shown by FIG. 2.

By imparting energy to PTM region 50, a phase transition of PTM region 50 can be induced. The transition in phase of PTM region 50 from a first phase to a second phase can be regarded as a change in the state of the PTM region 50. A change of a state of PTM region 50 can result in a change in a state of semiconductor structure 100 from a first state to a second state. If semiconductor structure 100 has at least two quasi stable states (having at least two distinguishable characteristics at an operating temperature) a memory can be defined. Providing energy to a PTM region 50 in such manner as to bring about a detectable state change of semiconductor structure 100 can be regarded as a writing to a memory. Sensing a state of semiconductor structure 100 can be regarded as a reading from a memory. Energy can be applied to PTM region 50 to induce a return transition of PTM region 50 to a previous phase and structure 100 to a previous state. Such energy impartation for returning a state of PTM region 50 to a previous phase and structure 100 to a previous state can be regarded as an erasing of memory.

For imparting energy to phase transition material region 50, a number of methods can be utilized. According to one method for imparting energy, heat need not be applied. For imparting energy to PTM region 50 without application of heat, an electric field can be applied to PTM region 50 without inducement of charge transport in PTM region 50 or channel 40 or in another area of semiconductor structure 100.

In one exemplary method for applying an electric field to semiconductor structure 100 as shown in FIG. 1, an electric field can be applied by applying a gate voltage (positive or negative) to gate 10 while a voltage of source 20 and drain 30 are held at a common voltage. For example, source 20 and drain 30 can be commonly grounded in one example.

According to one exemplary method for imparting energy to PTM region 50, heat can be applied to PTM region 50 to induce a transition in the phase of PTM region 50. In one method for applying heat, heat can be applied without passing current through PTM region 50, that is without charge transport (electron or hole transport) through the PTM region 50. In one embodiment, heat energy can be applied to PTM region 50 by passing current through PTM region 50 (via charge transport through PTM region 50). In one exemplary method for applying heat to PTM region 50, a voltage differential can be applied across drain 30 and source 20 to pass a current through channel 40 (to induce charge transport through channel 40) and resulting heat in channel 40 can be passed by thermal conduction to PTM region 50. There is therefore set forth herein in one embodiment a structure which utilizes a PTM region 50 to define memory states, wherein state changes are brought about without inducing charge transport through PTM region 50 and without inducing charge transport to or from the PTM region 50. In one embodiment, heat can be applied to PTM region 50 without an application of an electric field. In one exemplary method for imparting energy to PTM region 50, a combination of an electric field and heat can be applied to PTM region 50. For imparting energy to PTM region 50 in the form of combination of electric field and heat, there can be applied a voltage differential between source 20 and drain 30 to induce a current through channel 40. Further, there can be applied a gate voltage to gate 10 that is different than either the source voltage or drain voltage.

Figure 4:
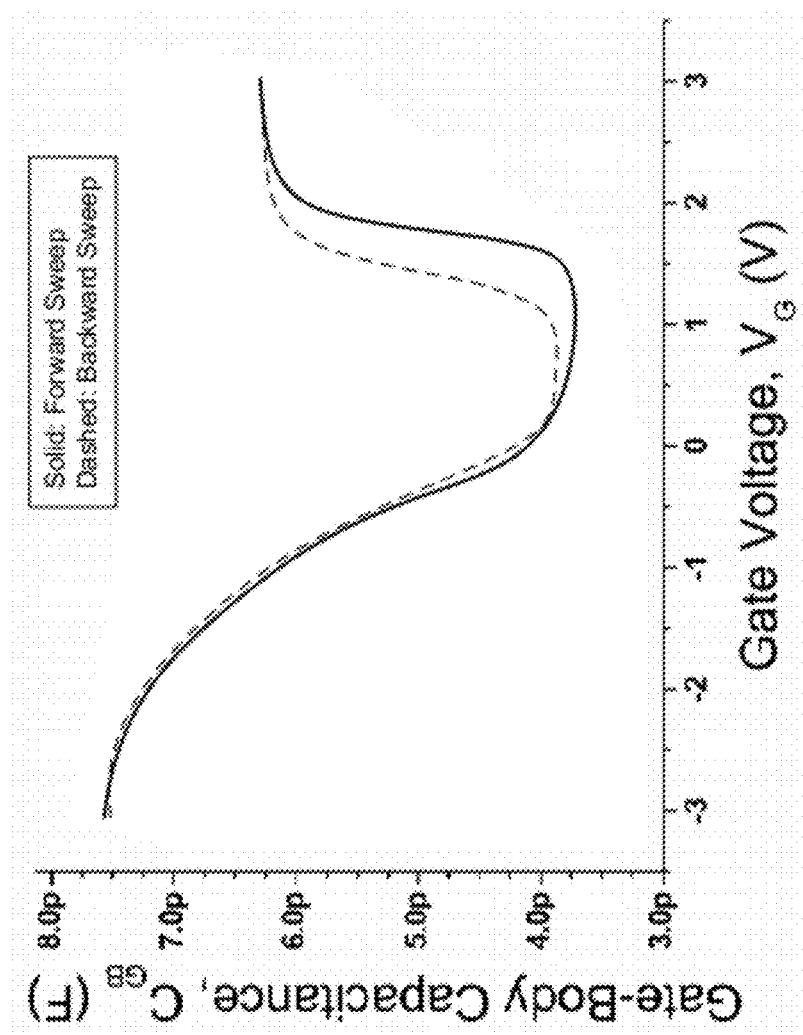
FIG. 4 is a plot showing capacitance of an exemplary PTM material region.

In FIG. 4, there is shown a plot illustrating a gate-channel capacitance of structure 100 for various gate voltages for the exemplary structure of FIG. 1 where source 20 and drain 30 are held at a common voltage (e.g., are commonly grounded) and where PTM region 50 is provided by a material capable of changing phase responsively to an electric field being applied to PTM region 50. In one embodiment, PTM region 50 can be provided by an oxide such as Vanadium oxide $VO_2$. The set of curves has a forward sweep curve (solid line) and a backward sweep curve (dashed line). The exhibited hysteresis between forward sweep gate-channel capacitance and backward sweep gate-channel capacitance indicates a memory function. More specifically, the plot of FIG. 4 illustrates that when an electric field is applied to PTM region 50, a phase transition of PTM region 50 can be induced which can result in at least two detectable states of structure 100, a state before application of the field and a state after application of the field. As FIG. 4 indicates, expected results without charge transport through channel 40, FIG. 4 indicates that a transition in phase of PTM region 50 can be induced without application of heat and without induced charge transport in PTM region 50, in channel 40, or in any other region of semiconductor structure 100. With a transition of a phase of PTM region 50 being induced without application of heat, power dissipation advantages of structure 100 should be apparent. Notwithstanding that a state change of PTM region 50 and of structure 100 can be brought about without application of heat, it can be advantageous in some instances to induce a phase transition of PTM region 50 and state change of structure 100 with application of heat energy, e.g., to increase speed of phase transition of PTM region 50 and/or to reduce a number of areas of applied voltages of semiconductor structure 100. In such embodiments, as phase transitions of PTM region 50 can be at least partially responsive to an application of field, it should be apparent that application of heat energy via charge transport through channel 40 can be maintained at modest levels so that power dissipation advantages continue to be realized.

Figure 5:
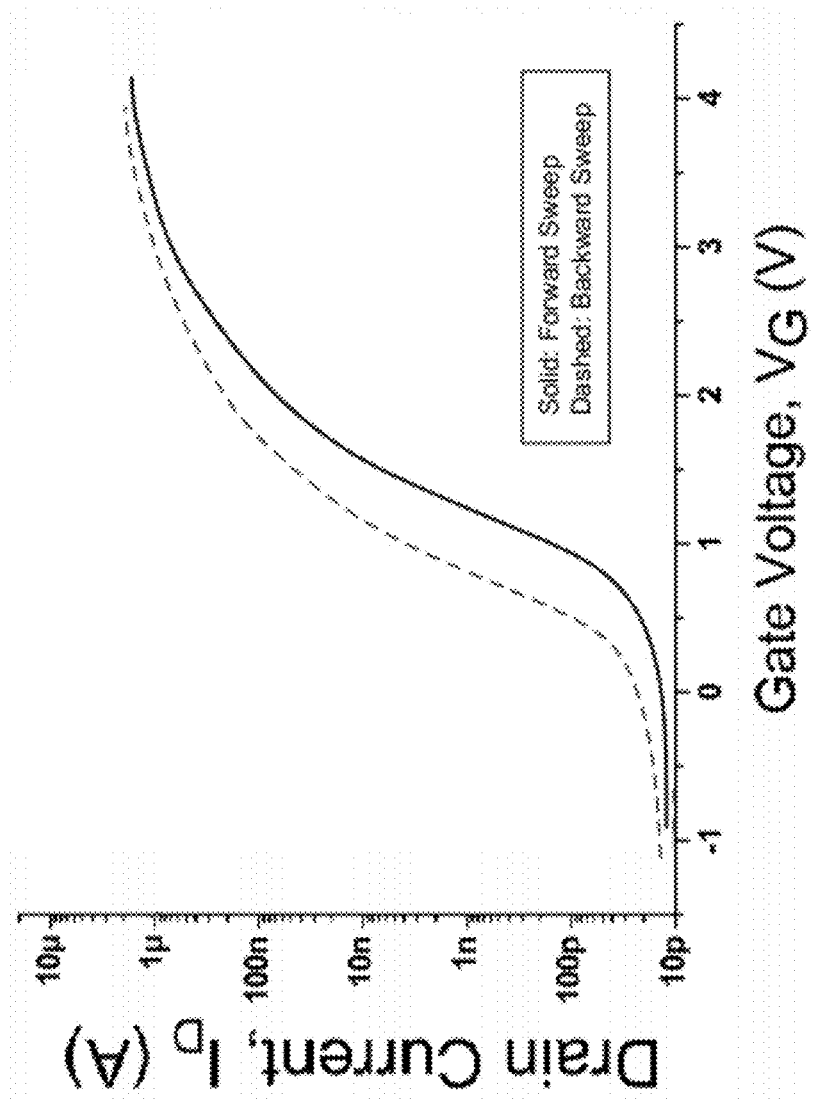
FIG. 5 is a plot showing drain current characteristics for an exemplary semiconductor structure.

In FIG. 5, there is shown a plot illustrating expected drain current (current through drain 30) as a function of gate voltage for the structure of FIG. 1 including the PTM region 50 having the capacitance characteristics of FIG. 4, and being capable of a phase transition responsively to an applied electric field. The plot illustrates that a semiconductor structure 100 as shown in FIG. 1 exhibits a hysteresis and a detectable state change. The set of curves shown include a forward sweep drain current curve and a backward sweep drain current curve. The exhibited hysteresis between forward sweep drain current and backward sweep drain current indicates a memory function. More specifically, the plot of FIG. 5 illustrates that after an electric field of an appropriate magnitude is applied to PTM region 50, there is a transition of the phase of PTM region 50 resulting in at least two detectable states of structure 100, a state before application of the field (indicated by the solid curve), and a state after application of the field (indicated by the dashed curve). Referring to FIG. 5, the state of structure 100 indicated by a forward sweep curve (solid curve) can occur when PTM region 50 is in an insulative phase and exhibits insulative behavior. The state of semiconductor structure 100 indicated by a negative sweep curve (dashed curve) can occur when PTM region 50 in a conductive (metallic) phase exhibits conductive behavior. Referring to FIGS. 4 and 5, application of a positive field (which can be accomplished by applying a positive voltage to $V_G$) can result in a phase transition of PTM region 50 from an insulative phase in which PTM region 50 exhibits insulative behavior to yield the state of structure 100 indicated by the solid curve, to a conductive phase in which PTM region 50 exhibits conductive behavior to yield a state of structure 100 indicated by the dashed curve. Application of a negative field (which can be accomplished by applying a negative voltage to $V_G$) can result in a phase transition of PTM region 50 from a conductive phase in which PTM region 50 exhibits conductive behavior to an insulative phase in which PTM region 50 exhibits insulative behavior (structure state illustrated by a solid curve).

Figure 6:
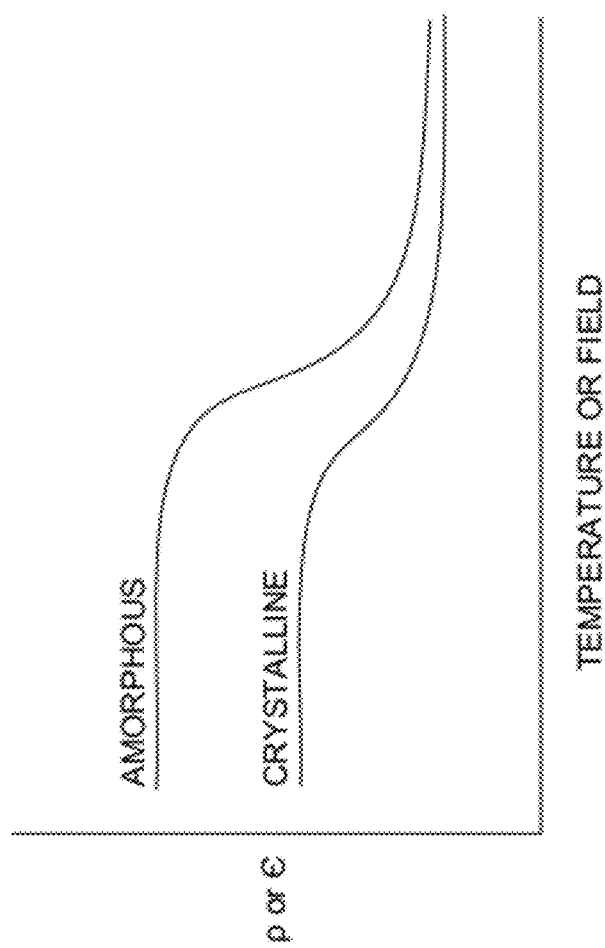
FIG. 6 is a plot showing conductivity characteristics for an exemplary PTM region.

In FIG. 6, there are shown conductivity vs. temperature plots for a phase transition material capable of a phase transition. Examples of phase transitions are, e.g., transitions from a crystalline phase to an amorphous phase, from a conductive phase to an insulative phase. Phase transition materials set forth herein can be material capable of phase transition in the form of transitions between an amorphous phase to a crystalline phase, commonly referred to as "phase change material" (PCM). Phase transition materials set forth herein can also be material capable of phase transition in the form of phase transition between crystalline insulative phase to a crystalline conductive phase. One example of such material is Vanadium oxide, $VO_2$. Referring to FIG. 6, conductivity behavior characteristics of the exemplary phase transition material can change when there is a phase change.

Figure 7:
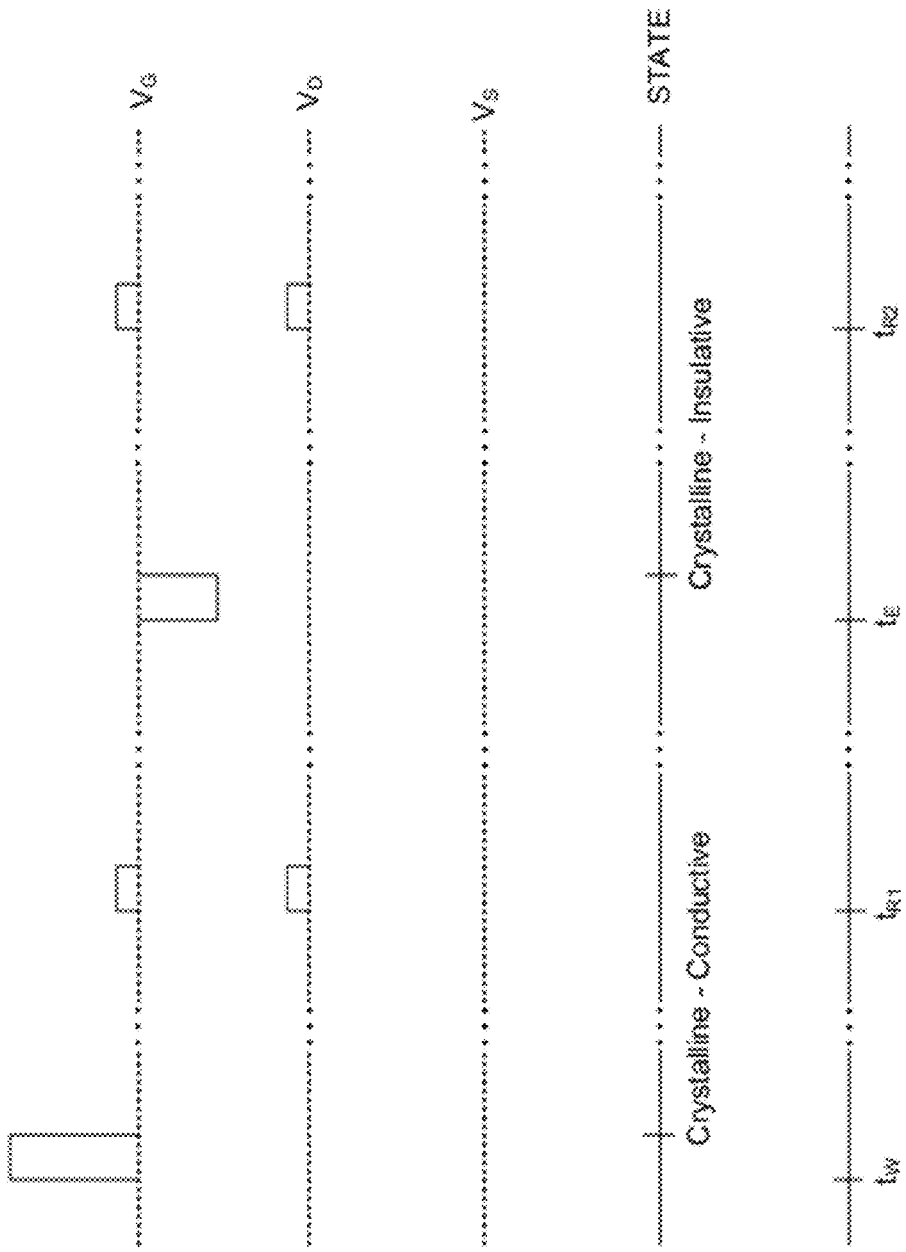

Exemplary writing and reading steps that can be carried out with use of structure 100 which incorporates PTM region 50 are described with reference to the timing diagrams of FIGS. 7, 8, and 9. With reference to FIG. 7, there are described methods for control of structure 100 in the case PTM region 50 is provided by a material (e.g., an oxide) capable of phase transition responsively to an applied electric field and includes performance characteristics corresponding to those shown in FIGS. 4 and 5. At time $t_W$, $V_G$ can be driven high to apply a positive electric field to PTM region 50 and to induce a phase transition of PTM region 50 from a crystalline-insulative phase to a crystalline-conductive phase. It will be seen that if the $V_G$ signal as shown in FIG. 7 is applied with PTM region 50 already in the conductive phase, the PTM region 50 will remain in the conductive phase. In the example of FIG. 7, $V_D$ is shown as being held to common voltage (e.g., commonly grounded) with $V_S$ during application of the field. In such manner, a field can be applied to PTM region 50 to result in a phase transition of PTM region 50 and a state change of structure 100 without inducement of charge transport in PTM region 50, in channel 40, or in any other region of structure 100. The application of $V_G$ at time $t_W$ can result in PTM region 50 changing phase from an insulative phase to a conductive phase. At time $t_{R1}$, there is a first read step. A read can be accomplished at time $t_{R1}$ by applying small voltages $V_G$ and $V_D$ with there being a small differential between $V_D$ and $V_S$ so that a drain current can be sensed. As the resulting current will be dependent on a state of structure 100, the resulting current will indicate a state of structure 100. The applied voltages can be controlled to be at such small levels so as to avoid a state change of PTM region 50 and of structure 100. At time $t_E$ (erase step) a negative field can be applied to induce a return of transition of PTM region 50 to the insulative phase resulting in structure 100 exhibiting behavior as indicated by the solid curve of FIG. 5. The negative field can be applied by applying a negative gate voltage $V_G$ with $V_D$ and $V_S$ being maintained at a common voltage, e.g., commonly grounded for returning PTM region 50 to its previous state. Energy can be applied to PTM region 50 to result in a phase transition of PTM region 50 without inducement of charge transport in PTM region 50, in channel 40, or in any other region of structure 100. It will be seen that application of the voltages as indicated at time $t_E$ with PTM region 50 already in the insulative state would result in the insulative state of the PTM region 50 and the corresponding state of structure 100 being maintained. At time $t_{R2}$, there is a second read step. Second read step at time $t_{R2}$ occurring with PTM region 50 in an insulator phase can be carried out by application of small gate and drain voltages, $V_G$, $V_D$ insufficient to result in a phase change of PTM region 50 with there being a differential between $V_D$ and $V_S$ so that a drain current can be sensed. As the resulting current will be dependent on a state of structure 100, the resulting current will indicate a state of structure 100.

Figure 8:
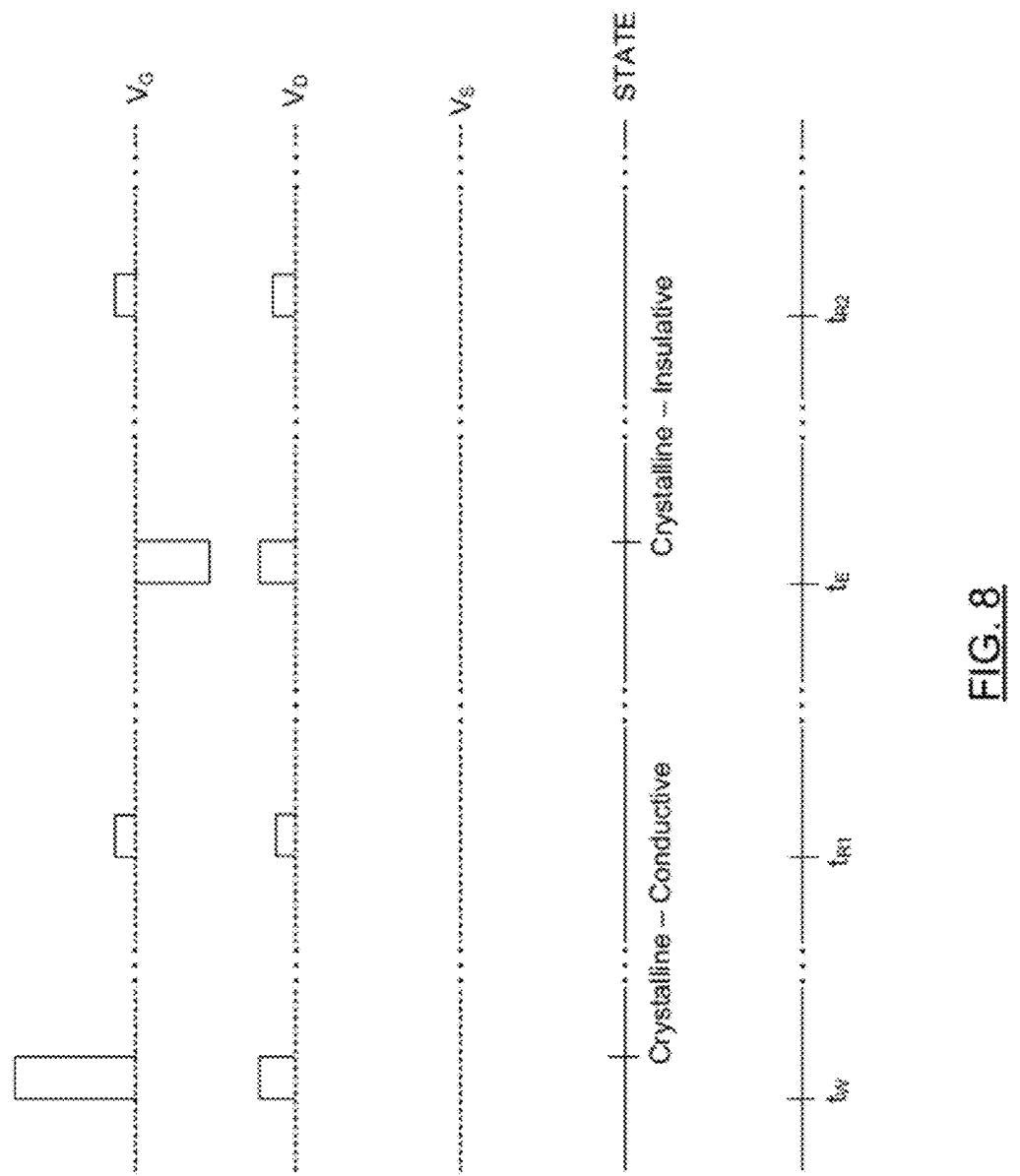

Referring to the timing diagram of FIG. 8, the timing diagram of FIG. 8 illustrates another exemplary method for control of structure 100 in the case PTM region 50 is provided by a material capable of phase transition responsively to an applied electric field. The control method illustrated in FIG. 8 is the same as that indicated in FIG. 7 except that at the write and erase times, $t_W$, $t_E$, a drain voltage $V_D$ is applied to $V_D$. In such manner, a drain current can be induced resulting in charge transport through channel 40, and applied heat to PTM region 50. In such manner, a phase transition PTM region 50 (which can be regarded as a states change of PTM region 50) and state change of semiconductor structure 100 can be induced with a combination of applied electric field energy and applied heat energy, but without charge transport being induced in PTM region 50. With phase transition being responsive at least partially to an applied field, heat dissipation throughout structure 100 can be reduced as compared to an alternative apparatus in which energy applied for inducing a phase change of a phase transition material does not include field energy. Avoiding inducement of charge transport in PTM region 50, in channel 40, and remaining regions of structure 100 can be advantageous for power dissipation purposes. In one embodiment, inducement of charge transport through channel 40 can be advantageous, e.g., for increasing a speed of a phase transition.

The timing diagram of FIG. 9 illustrates exemplary control of structure 100 (FIG. 1) with PTM region 50 being provided by a phase change material (PCM) capable of phase change between an amorphous and crystalline phase, e.g., Germanium Antimony and Tellurium (GeSbTe), commonly known as "GST." At time $t_W$, $V_D$ and $V_G$ can both be driven high to cause current flow through channel 40 and heating of PTM region 50. A fall time of $V_D$ and $V_G$ can be controlled to control the phase of PTM region 50. With a relatively fast fall time, a transition of PTM region 50 to an amorphous phase can result (or the amorphous phase can be maintained if the material is already in the amorphous phase). With a relatively fast fall time, PTM region 50 can be quenched before crystallization is achieved. At time $t_{W1}$, relatively full fast full time $V_D$ and $V_G$ voltages are applied. With a relatively fast fall time, an amorphous phase can result. At time $t_{R1}$, there is a first reading of structure 100. For sensing of a state of structure 100 with the PTM region 50 in a crystalline state, a moderate gate voltage can be applied with a small drain voltage. As the resulting current will be dependent on the state the current will indicate the state of the structure.

At time $t_E$ (erase step), $V_D$ and $V_G$ can both be driven high to cause current flow through channel 40 and heating up of PTM region 50. The $V_D$ and $V_G$ signals applied at time $t_E$ have relatively slow fall times so that a crystalline state of PTM region 50 results from application of the $V_D$ and $V_G$ signals. For inducing a transition to a crystalline phase, a cooling cycle can be carried out by decreasing voltages applied to structure 100 at a sufficiently slow rate to allow crystallization of PTM region 50 to occur. A second read step can ensue at time $t_{R2}$. For sensing of a state of structure 100 with PTM region 50 in an amorphous state, a moderate gate voltage can be applied with a small drain voltage. As the resulting current will be dependent on the state of structure 100, the current will indicate the state of the structure 100. It should be noted that the waveforms for $V_G$ and $V_D$ as shown in FIG. 8 are exemplary only; in general, where PTM region 50 is provided by a phase change material (PCM) capable of changing between an amorphous and crystalline states, quenching of the PTM region 50 at a faster rate can be expected to result in PTM region 50 remaining or becoming more amorphous while decreasing applied voltages at a slower rate can be expected to result in PTM region 50 remaining or becoming more crystalline. In one particular example, the waveform applied at time $t_W$ can be replaced by a short duration square wave pulse.

Figure 10:
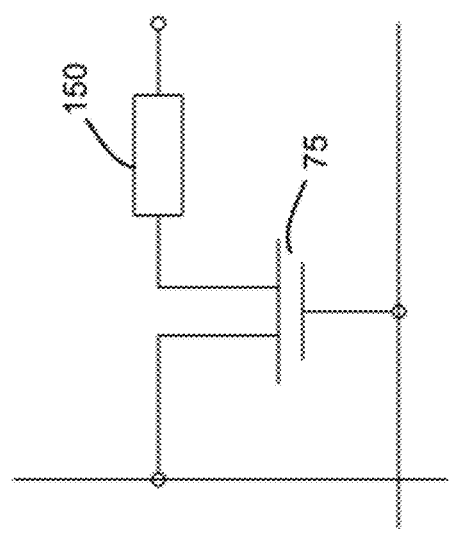

Methods and apparatus set forth herein provide significant advantages over currently available apparatus and methods. A representation of a known memory structure utilizing phase change material is set forth in FIG. 10. In the structure of FIG. 10, where transistor 75 is often referred to as an access element, a conductivity of phase transition material (PTM) provided by a phase change material (PCM) region 150 changes from a first state to a second state on the passing of current (on charge transport) through PCM region 150. "Phase change material (PCM)" is a term commonly used to refer to a material that changes phase from an amorphous phase to a crystalline phase, to define two different sets of behavior and states of a material. Problems have been noted with the design of FIG. 10, including power dissipation problems, timing and scaling issues. As the structure includes two elements (an access element in addition to a PCM region) space consumption issues are also significant.

Figure 11:
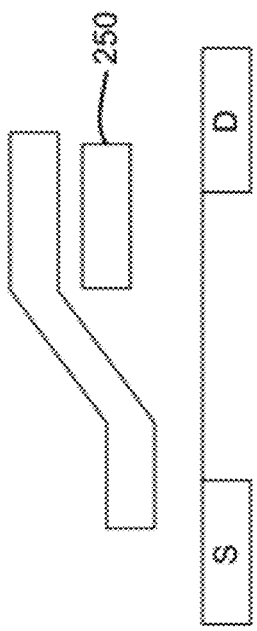
FIGS. 10 and 11 illustrate prior art memory structure.

Referring to FIG. 11, there is shown an exemplary Flash memory structure including a floating gate architecture wherein electrons jump to floating gate 250 during a write step, and wherein electrons are pulled off floating gate 250 during an erase step. High voltages, e.g., in the range of 15V-20V are often utilized for accomplishing the writing and erase steps. The structure of FIG. 11 has been observed to exhibit charge trapping induced degradation problems and power dissipation problems. In one commercially available embodiment of a Flash memory, a voltage of 15V is applied for causing a state change.

Methods and apparatus set forth herein illustrate that a detectable state change of semiconductor structure 100 can be yielded without the state change being dependent on charge transport through a PTM region 50 of a semiconductor structure 100. Accordingly, significant power dissipation advantages can be realized while avoiding significant device degradation problems. In one embodiment, a phase change of PTM region 50 can be partially or wholly responsive to applied electric field. In such embodiments, it can be seen that further power dissipation advantages can be realized and that further charge trapping degradation problems associated with charge transport can be reduced or avoided.

EXAMPLE 1

$VO_2$ is sandwiched between thermal $SiO_2$ and top ALD $SiO_2$ on an NMOS active layer and devices having the configuration of structure 100 (FIG. 1) were fabricated using CMOS processing technology. FIG. 1 shows the schematic of this phase transition memory (PTM region) device. Channel implantation with Boron was performed with 40 keV energy at a dose of $2 \times 10^{12}$ $cm^{-2}$. Active area is defined by optical lithography and Arsenic implantation to define source/drain employed a dose of $3 \times 10^{15}$ $cm^{-2}$. After annealing the wafer, silicon thermal dioxide (15 nm) was grown, followed by the deposition of vanadium dioxide in Ar (91.2%) and $O_2$ (8.8%) environment at 10 mTorr [5] and an ALD process for $HfO_2$ dielectric layer. For the source/drain contact, $CHF_3$ with $O_2$ gas was used to etch $HfO_2$ film. Ti/Al metal gate was evaporated for the lift-off process.

Figure 12:
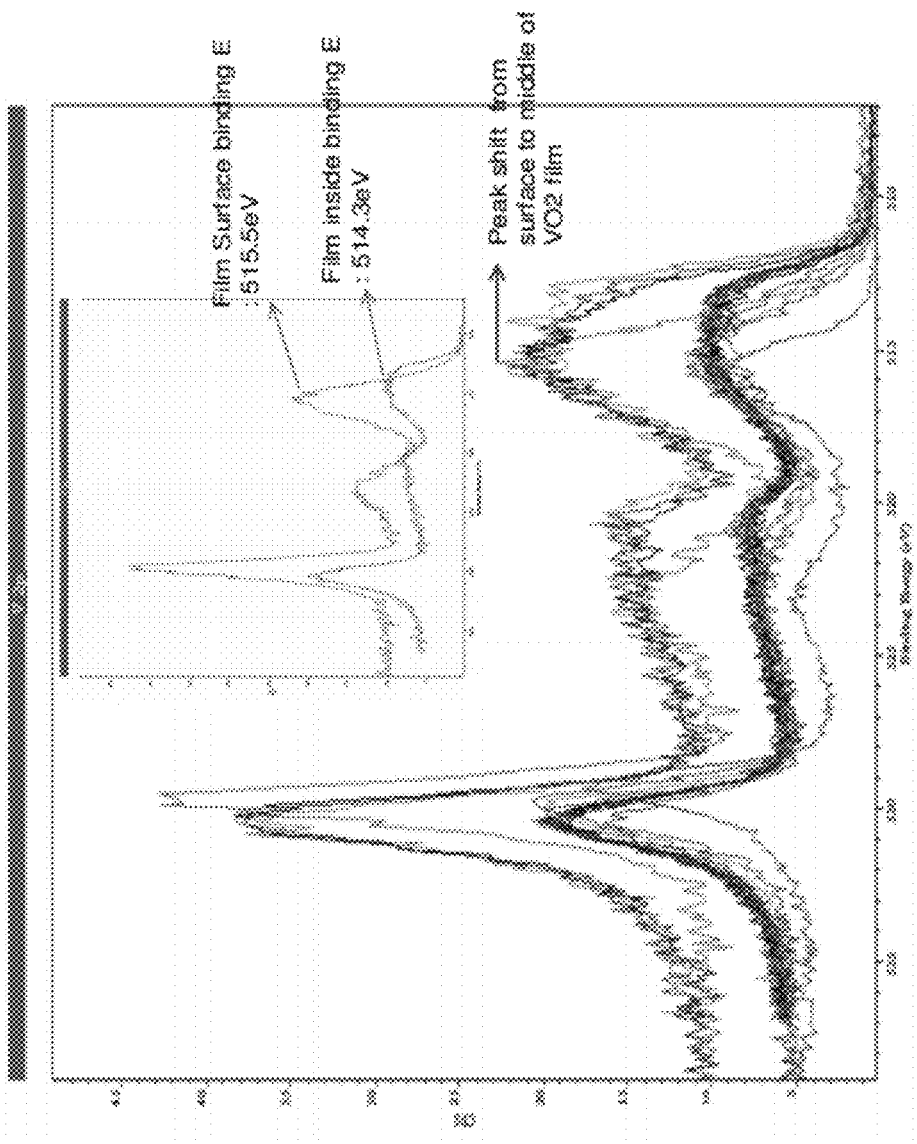
FIG. 12 illustrates XPS analysis for a V(2p) signal for an exemplary structure.
Figure 13:
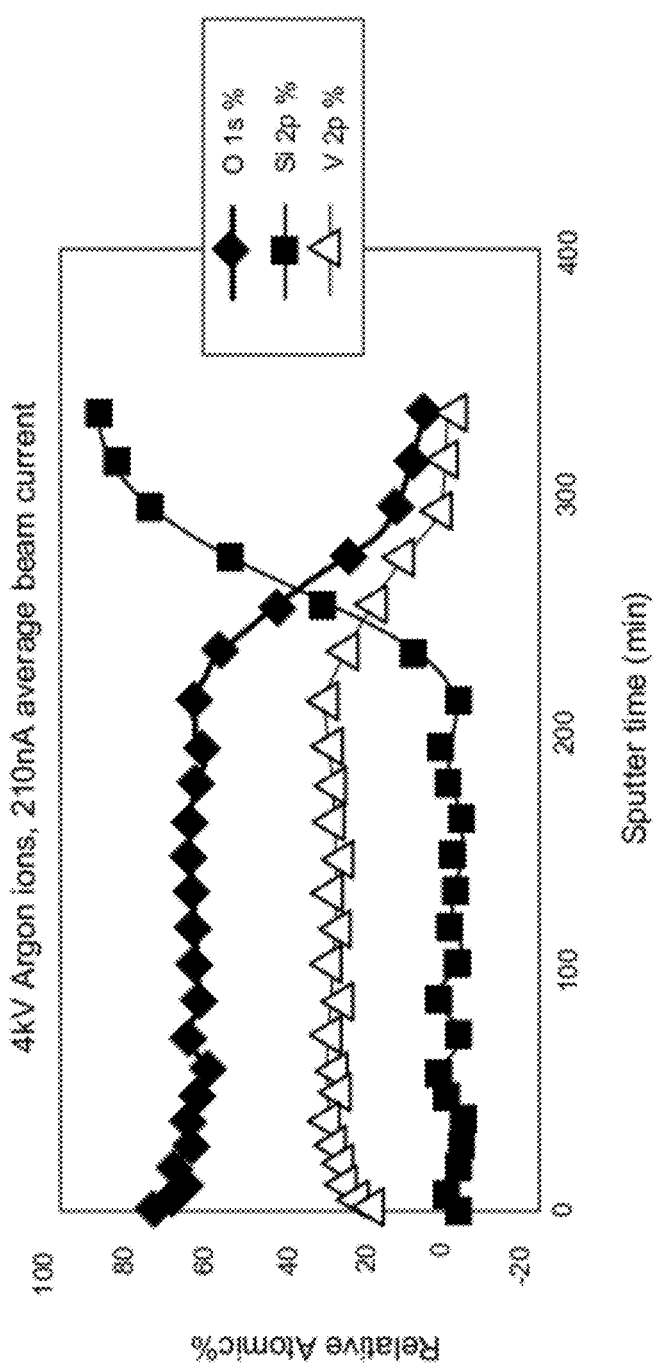
FIG. 13 illustrates relative atomic concentration ratio of V and O. For an exemplary structure.
Figure 14:
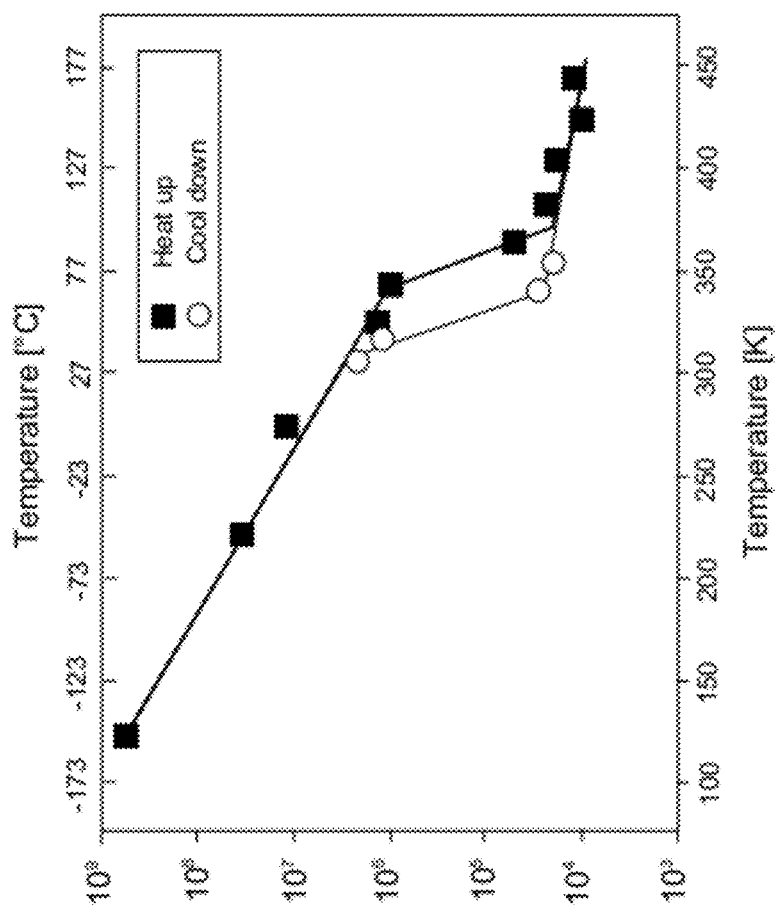
FIG. 14 illustrates electrical resistance measurement of a $VO_2$ For an exemplary structure.
Figure 15:
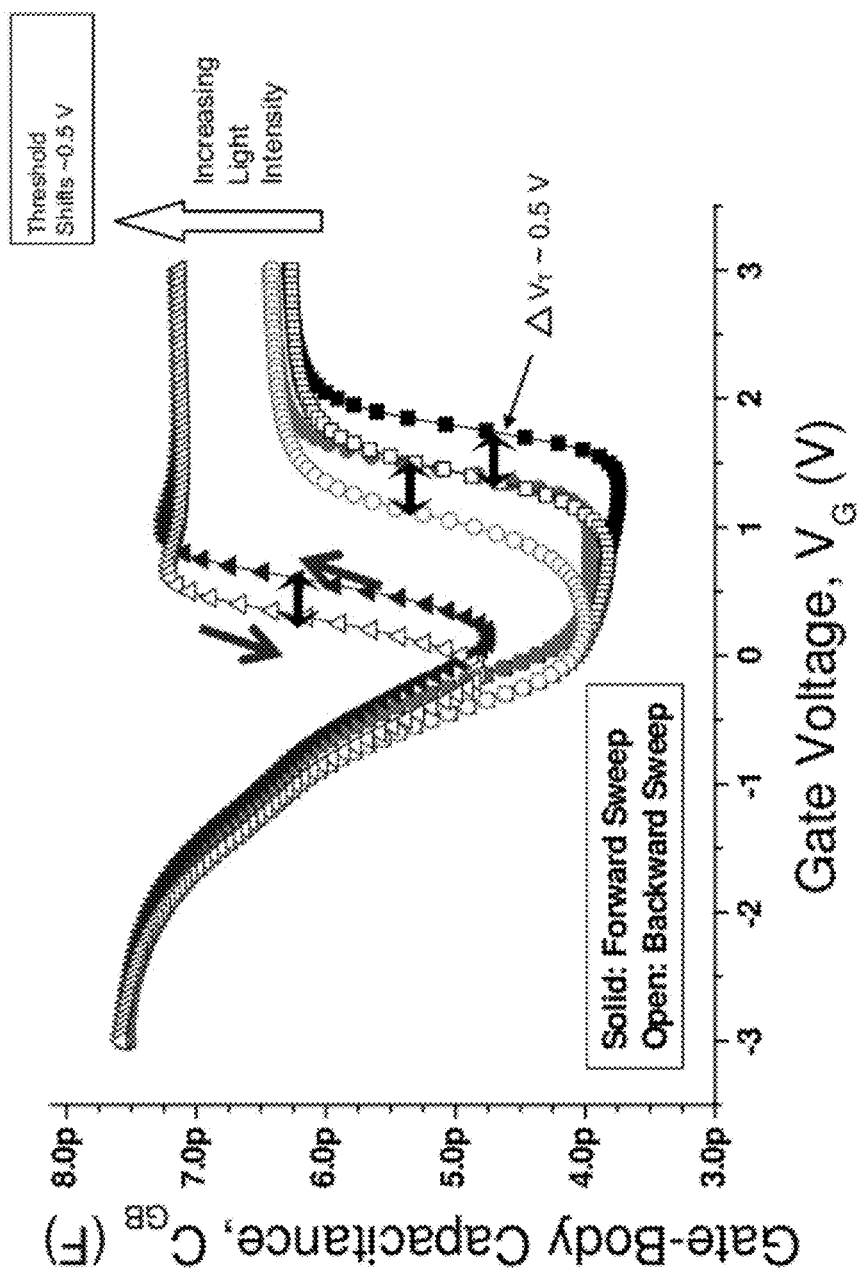
FIG. 15 illustrates field hysteresis in phase transition capacitors for an exemplary structure.
Figure 16:
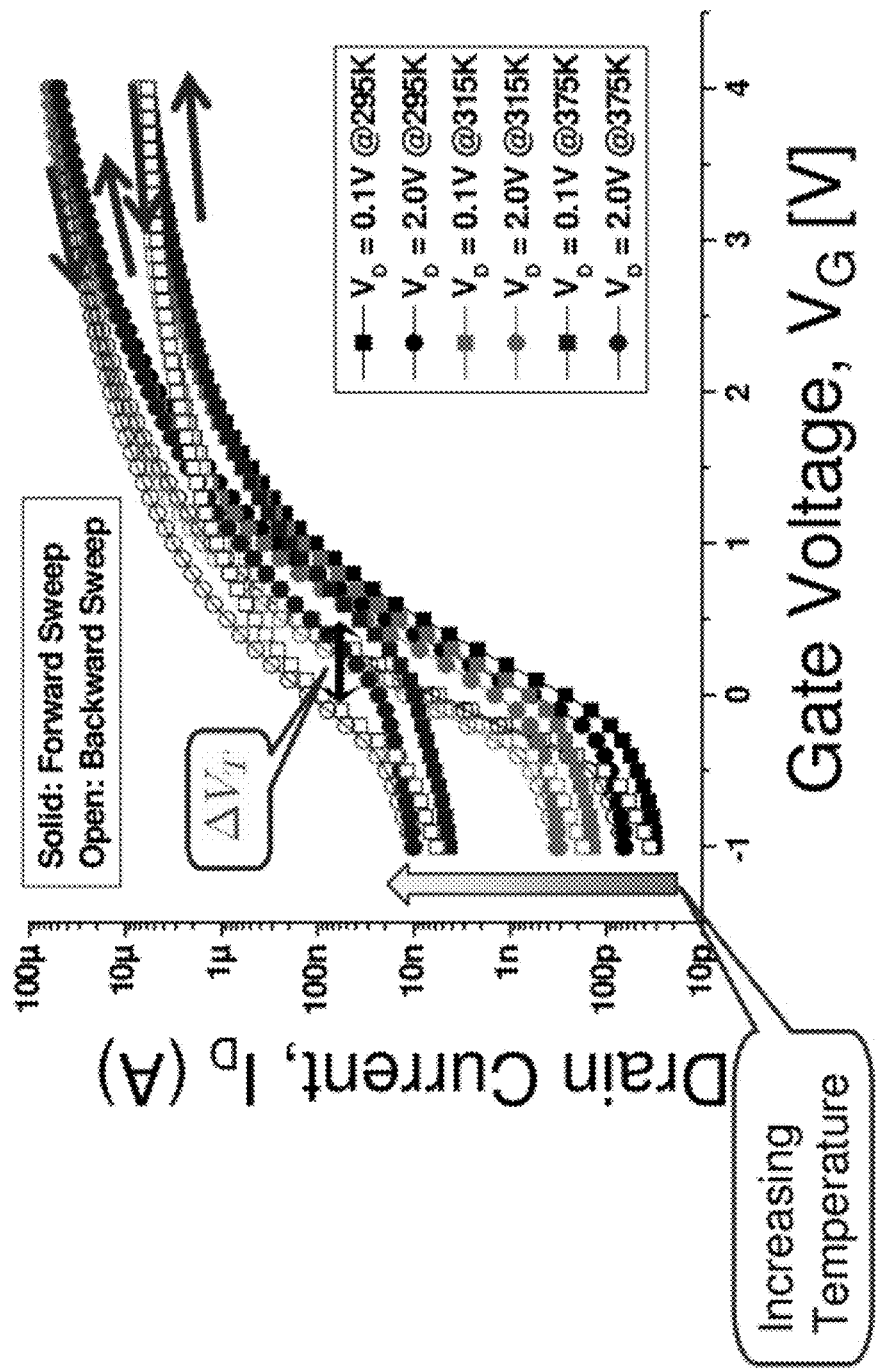
FIG. 16 illustrates gate bias dependent hysteresis in transistors for an exemplary structure.
Figure 17:
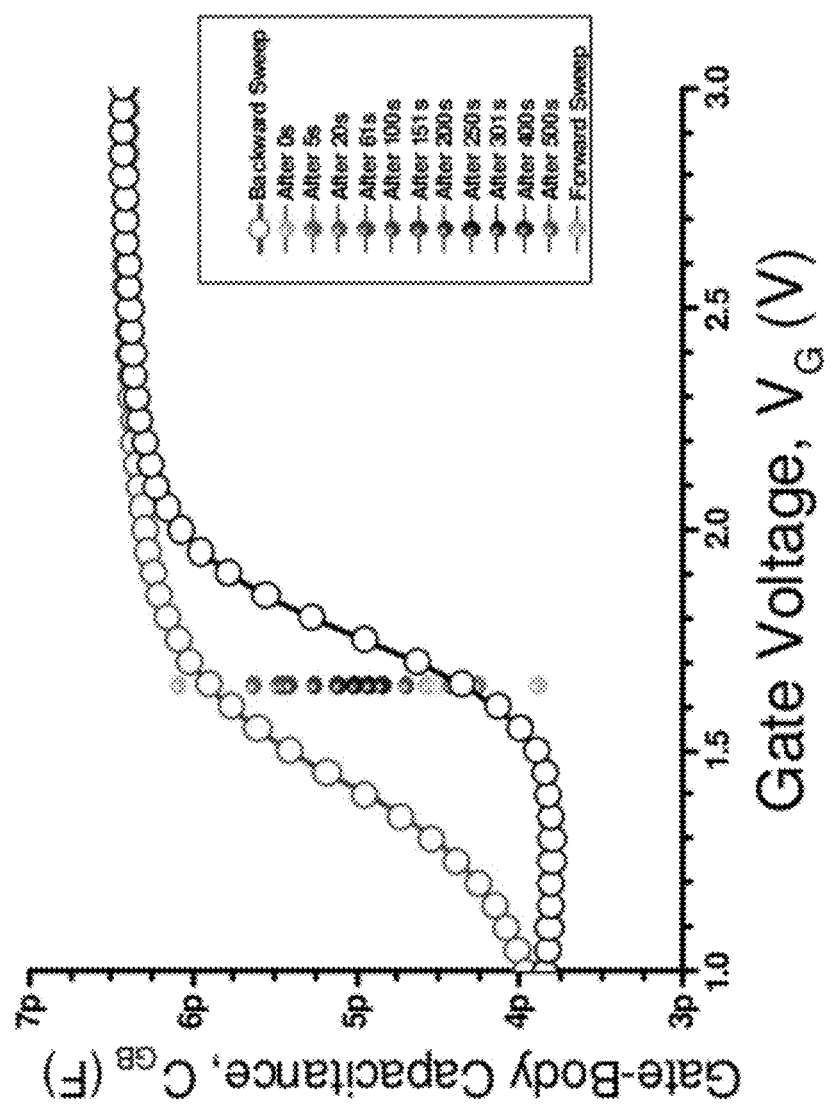
FIG. 17 illustrates decay of capacitance at 1.54V with time for an exemplary structure.

Elemental composition employed X-ray photoelectron spectroscopy (XPS) analysis. FIG. 12 shows that V(2p) peaks at binding energy vary from 515.5 eV (film surface) to 514.3 eV (inside of the film). FIG. 13 shows the atomic concentration ratio between V(2p) and O(1s) in which the ratio of V(2p) and O(1s) is around 1 to 2.1 in the middle of the film and 1 to 3.3 on the surface. This implies that the vanadium oxide film in our experiments is composed of the family of various vanadium oxides depending on the sputtering temperature and oxygen gas flow rate. FIG. 14 shows the electrical resistance measurement on a $VO_2$ film with varying temperatures. It has hysteresis characteristics with ~30° C. of temperature window and begins to transit at ~70° C. by $10^2$ Ohm/Sq, which is not comparable with the very well qualified $VO_2$ films. Without being bound to a single theory, this behavior is likely due to the presence of uneven surface morphology and non-stoichiometric composition of sputtered $VO_2$ films. The capacitor and transistor characteristics are shown in FIGS. 15, 16, and 17. Threshold voltage is reduced by positive gate bias related to thermal and field-induced effects in FIG. 15. It is not caused by charges trapping since there is no charge injection and no current due to the thick $SiO_2$ layers in the capacitor structures. Strong light intensity caused the acceleration of formation of inversion layers in MOS structures. Threshold voltage shift around 0.5 V, in transistors is consistent with capacitors, and it happens at all temperatures of interest. This indicated field-induced phenomena. Drain bias also affects the hysteresis characteristics because it changes the field across the transistor. FIG. 16 illustrates gate bias dependent hysteresis in transistors. The current amplitude changes due to the mobility drop as temperature and threshold shifts. The decay of the capacitance with time is shown in FIG. 17. These characteristics indicate metastability in the tested structure but with a reasonably large time window. The tested structure is operational at low voltages, is silicon compatible, is single element, and avoids charge trapping induced degradation issues. It is seen that state change of the tested semiconductor structure can be achieved with an applied gate voltage of on the order of about 3V, as compared to 15V in the case of a Flash memory.

In bulk $VO_2$, the sheet resistance change from metal to the other phase is around 2-order. In our processed structures, this change is smaller than best published results mainly due to non-stoichiometric composition of $VO_2$ film and additional processing. We have observed threshold voltage shift of ~0.5 V due to thermal and field effect in transistors and in capacitor structures. This memory structure operates at very low voltages is useful for a variety of memory applications.

END OF EXAMPLE 1

In this invention we show and claim the use of phase transition, in a region of device, where electron transport itself or to and from it does not occur, but whose material property consequences are coupled to the device area where transport happens, such as the silicon electron or hole channel. Appealing and useful properties can be extracted through such an implementation.

We show achieving of bistability at low powers with increased immunity to dimensions for rapid non-volatile memories. We also show how phase transition can be used to rapidly change the turn-on characteristics of a device, so that it changes currents faster than the 60 mV/decade expected conventionally.

In order to achieve a memory function, one needs two quasi-stable states. In electronic silicon non-volatile memories, the quasi-stable states are achieved by storing charge on a continuous or discrete floating gate region surrounded barrier regions made of silicon dioxide and/or other dielectrics that prevent leakage of stored charge. The presence or absence of this charge is measured through the operation of a transistor whose threshold voltage is affected by the stored charge. A non-volatile memory is usually implemented with two stable states, but more are possible depending on the ability to achieve distinction between reproducible stored charge number, as also in the location of the charge, e.g., between the source-end region and drain-end region of a transistor. Thus, these nonvolatile memories depend on electron transport phenomena, both in the transistor which is the reading and writing medium, and the floating gate region. There are additional approaches to memories. One group of approaches aims to achieve non-volatile memory where a transistor is coupled to an additional passive element, a ferroelectric element where polarization is changed, a capacitor where charge is stored, or a phase change element where the resistance of a conducting element is changed. These elements operate by changing the conductivity between high and low states in the path of a cell through which current flows. Such memories have been called the phase change memories. The important characteristic in these memory structures is that particle current flows through the phase change element and is an essential part of the changing its state and reading the state. Changing temperature for causing phase change requires large current to flow because of the areas and volumes and bulk material involved which can be in a highly conducting state.

The conductivity of a channel depends on how the gate of a device couples to the channel. If there is strong electrostatic coupling (such as when effective insulator is thin), the conductivity can be higher for the same applied bias. Thus, if phase transition can be accomplished without passing current through the phase transition material, a new form of memory, and because of the change in the coupling properties, a transistor can be formed. This invention describes how such a phase transition can be achieved through temperature change or through electric field change. We also show how one can use this ability to cause phase transition and by changing the transition between multiple states achieve memories where two stable states that can be measured, and transistors by affecting the turn-on and turn-off behavior of a transistor.

Figure 18:
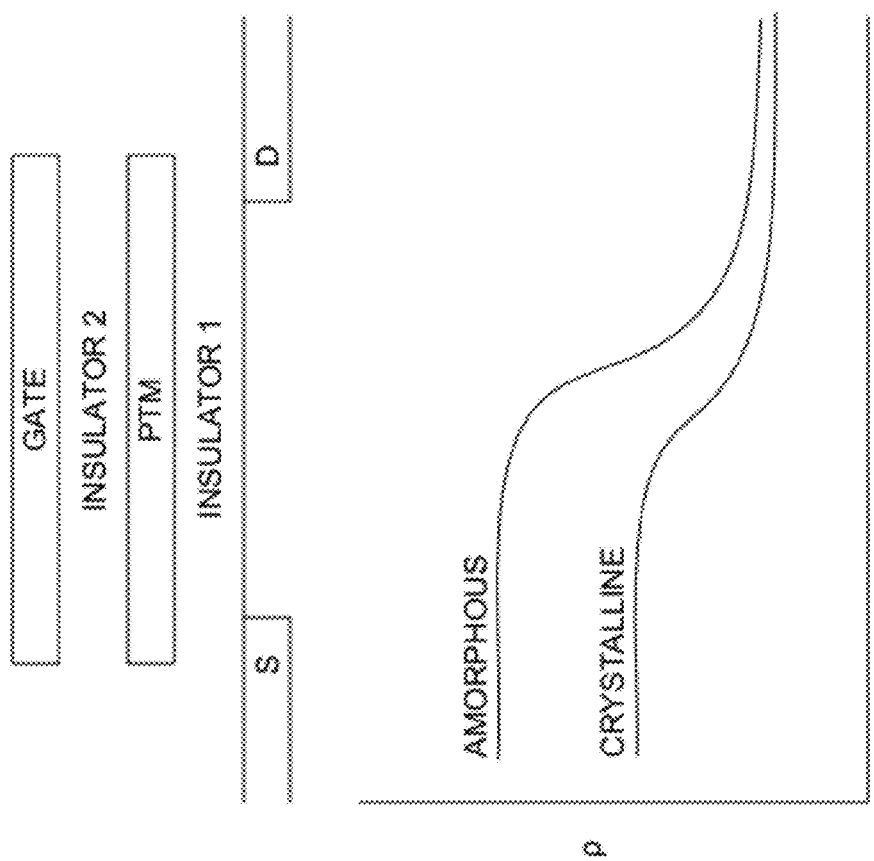
FIG. 18 illustrates a phase transition material intervening two insulators between the gate and the channel of a transistor/memory structure. The resistivity of the material can be changed through a change in temperature and shows a hysteretic behavior. A way to achieve this is amorphous-crystalline transition such as in many chalcogenides, e.g., materials used, CDs, and DVDs. The ramp rate of heating and cooling (achieved by the power applied to the device) determines whether the PTM region is in amorphous state or crystalline state. The two states have different dielectric and conductive behavior leading to two observable states in the field-effect conductivity and device operation between source and drain. These states are programmed by heating and quenching cycles, and can be read without heating/cooling, i.e., with lower bias voltages.

FIG. 18: A phase transition material intervening two insulators between the gate and the channel of a transistor/memory structure. The resistivity of the material can be changed through a change in temperature and shows a hysteretic behavior. A way to achieve this is amorphous-crystalline transition such as in many chalcogenides, e.g., materials used CDs and DVDs. The ramp rate of heating and cooling (achieved by the power applied to the device) determines the whether the PTM region is in amorphous state or crystalline state. The two states have different dielectric and conductive behavior leading to two observable states in the field-effect conductivity and device operation between source and drain. These states are programmed by heating and quenching cycles, and can be read without heating/cooling, i.e., with lower bias voltages.

Figure 19:
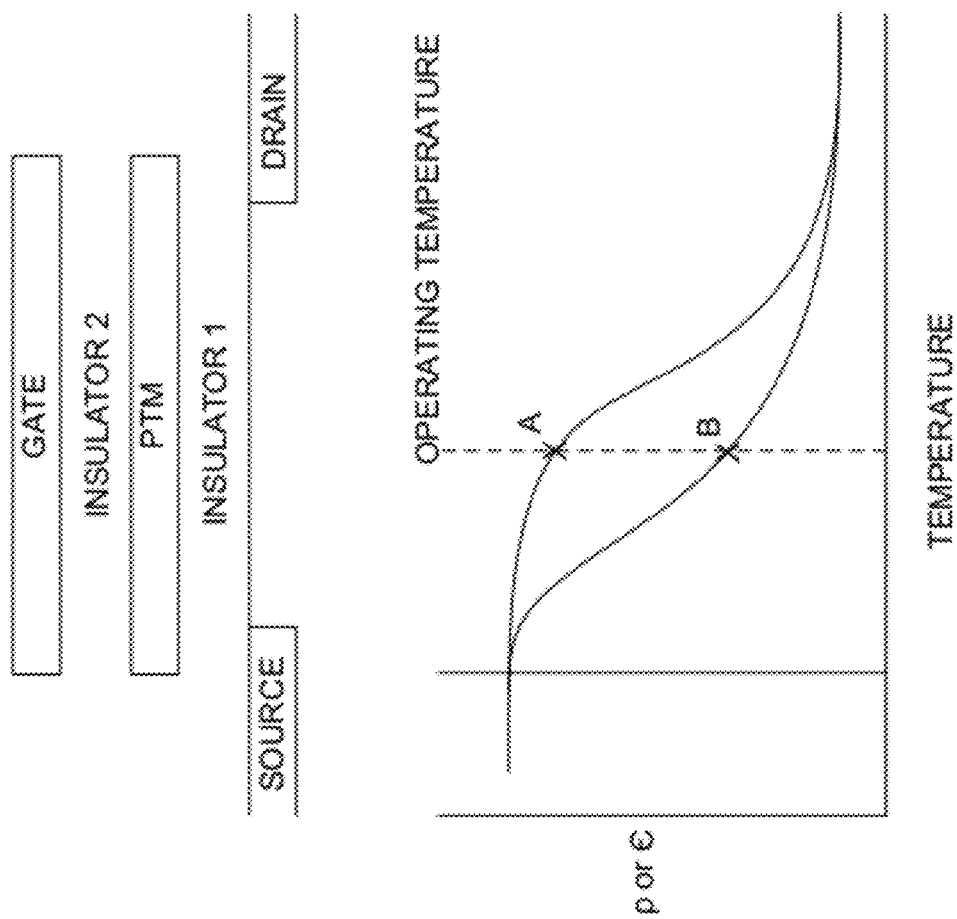
FIG. 19 is a phase transition material intervening two insulators between the gate and the channel of a transistor/memory structure. The resistivity of the material can be changed through a change in temperature and shows a hysteretic behavior. If the hysteretic behavior is at transistor operations conditions, bistable condition where A and B states are possible are achieved. The metal-insulator or resistivity transition can be used to determine the state of the memory. Complex oxides are one example of materials where such characteristics can be observed.

FIG. 19: A phase transition material intervening two insulators between the gate and the channel of a transistor/memory structure. The resistivity of the material can be changed through a change in temperature and shows a hysteretic behavior. If the hysteretic behavior is at transistor operations conditions, bistable condition where A and B states are possible are achieved. The metal-insulator or resistivity transition can be used to determine the state of the memory. Complex oxides are one example of materials where such characteristics can be observed.

Figure 20:
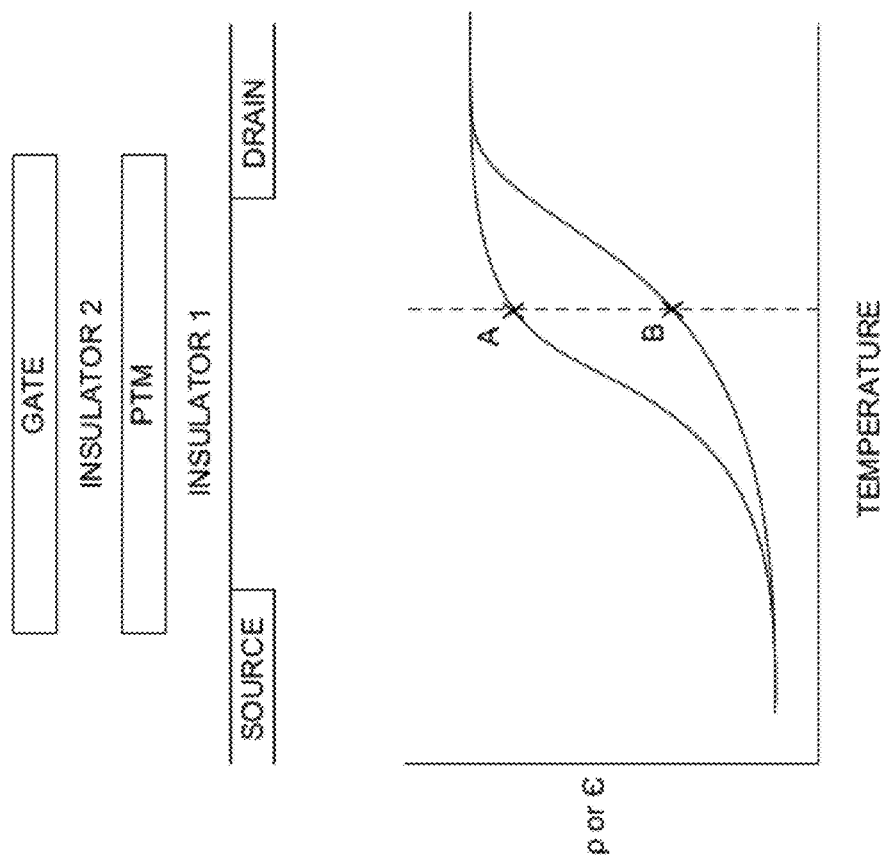
FIG. 20 is a reverse of FIG. 19 where the resistivity or dielectric constant of the phase transition material is affected opposite of FIG. 19. States A and B can be observed by low voltages and currents applied to the device.

FIG. 20: The reverse of FIG. 19 where the resistivity or dielectric constant of the phase transition material is affected opposite of FIG. 19. States A and B can be observed by low voltages and currents applied to the device.

Figure 21:
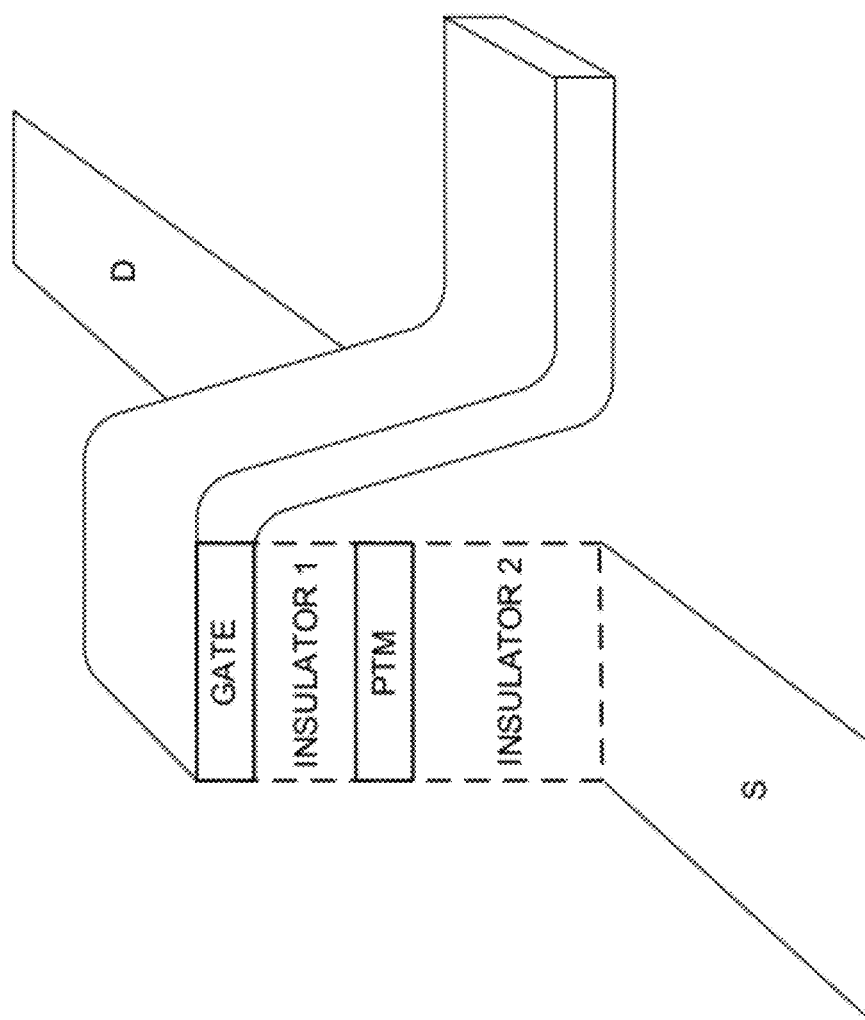
FIG. 21 illustrates devices that can be made where the phase transition region is disconnected from the control gate. This structure looks like a Flash memory structure. Except the floating gate, a phase transition material does not have charge injected into it. Its properties are changed by changing temperature, or changing field which cause the phase transition.

FIG. 21: Devices can be made where the phase transition region is disconnected from the control gate. This structure looks like a Flash memory structure. Except the floating gate, a phase transition material does not have charge injected into it. Its properties are changed by changing temperature, or changing field which cause the phase transition.

Figure 22:
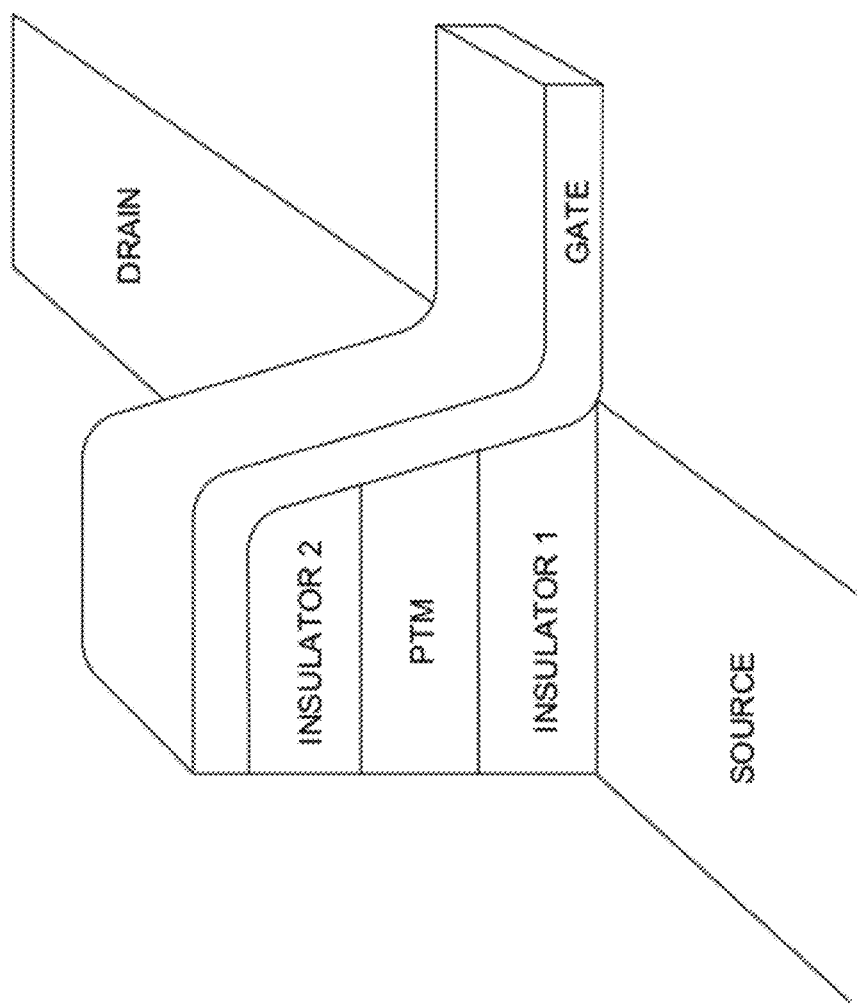
FIG. 22 illustrates a device where PTM region is connected to the gate. In this case, when the property of the PTM region changes, the electrostatic control from the gate of the channel changes. If PTM region becomes conducting, it is a smaller insulator transistor with a tighter threshold conduction.

FIG. 22: Device where PTM region is connected to the gate. In this case, when the property of the PTM region changes, the electrostatic control from the gate of the channel changes. If PTM region becomes conducting, it is a smaller insulator transistor with a tighter threshold conduction.

Figure 23:
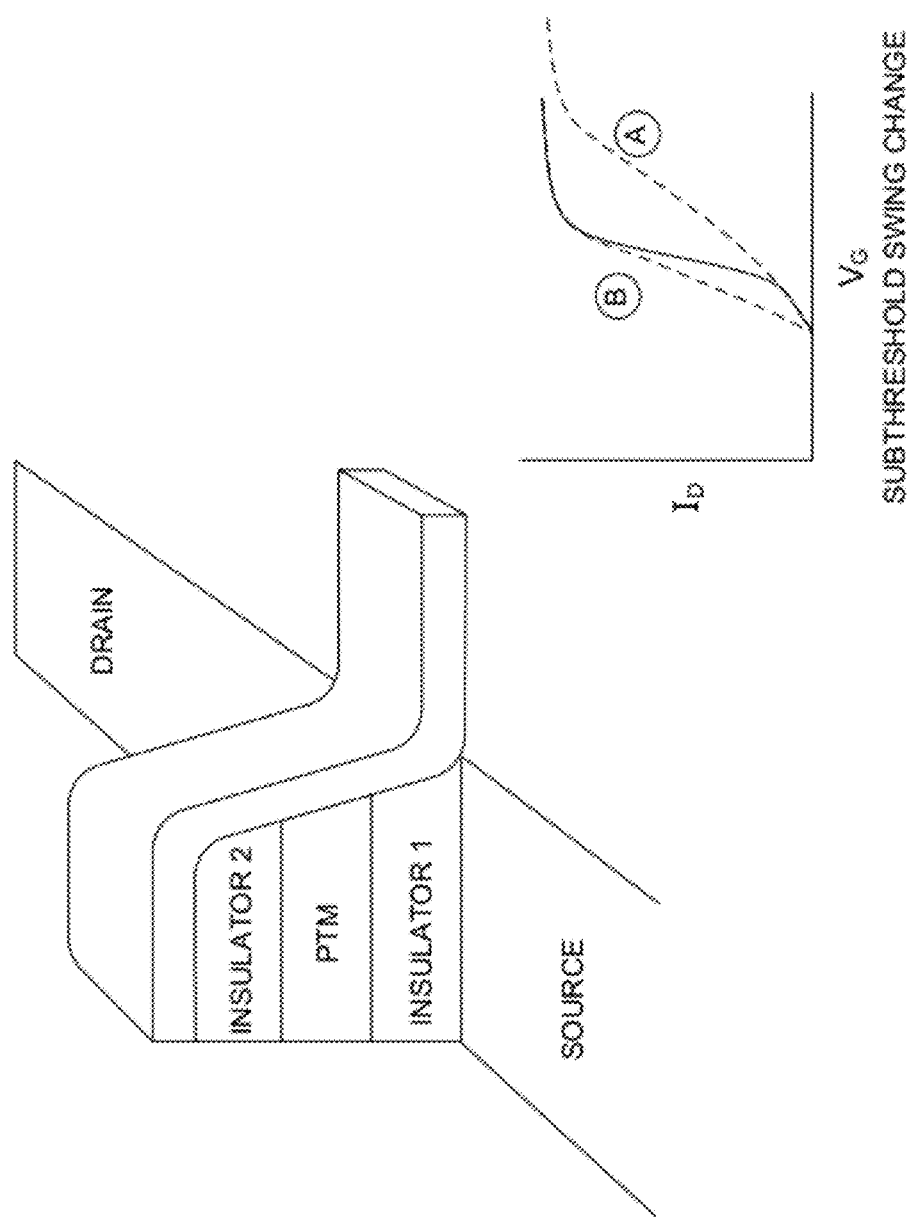
FIG. 23 illustrates a device where due to the change in PTM region properties, the transfer characteristics of the device change in the presence of the gate field. In this case, the field change causes PTM region to change properties, and as a result the transistor shows a transition in the subthreshold swing.

FIG. 23: Device where due to the change in PTM region properties, the transfer characteristics of the device change in the presence of the gate field. In this case, the field change causes PTM region to change properties, and as a result the transistor shows a transition in the subthreshold swing.

Figure 24:
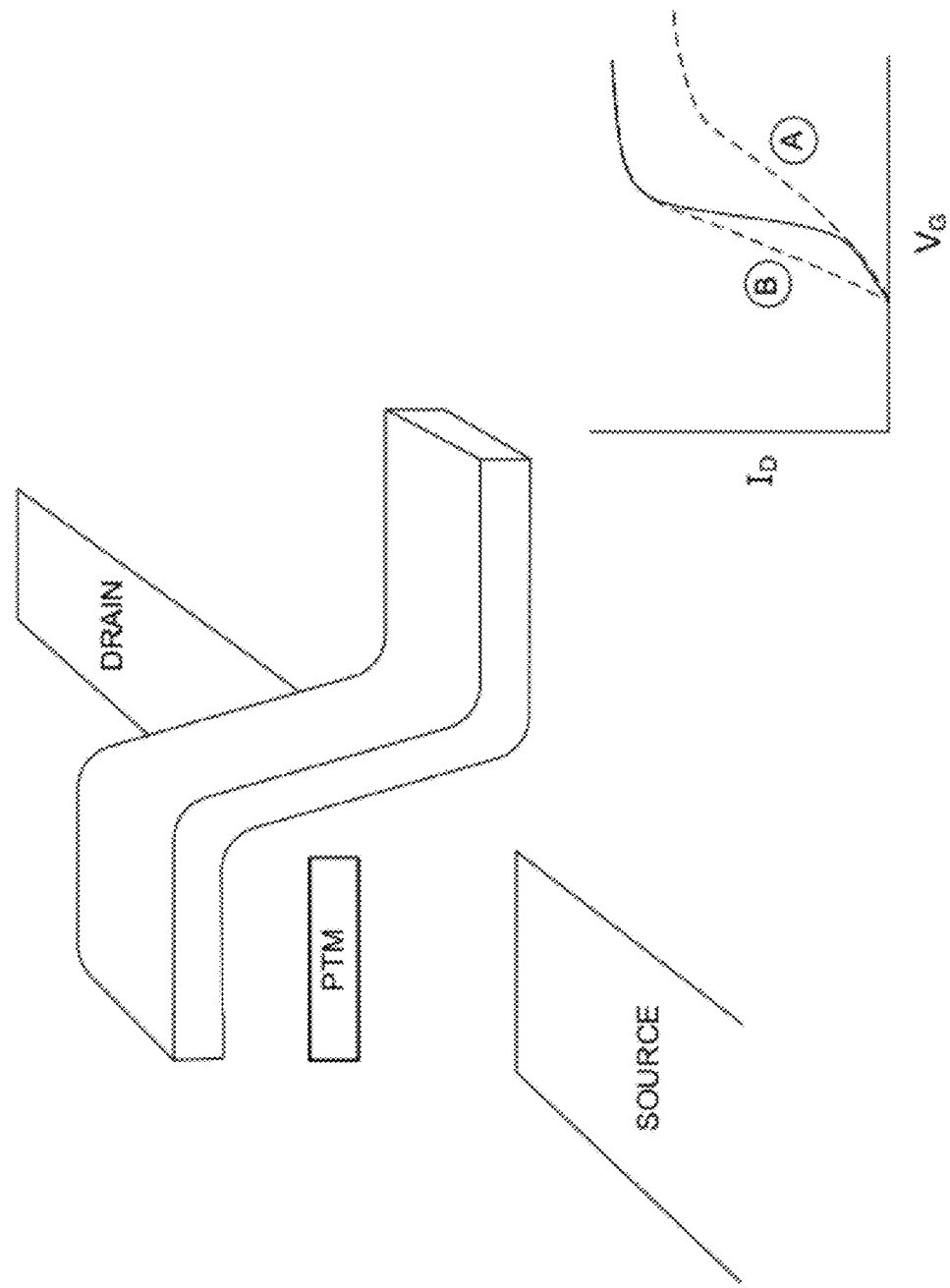
FIG. 24 illustrates a device similar to FIG. 23 but the transition occurs without the connection between the gate and the PTM region. The field caused by the gate causes PTM region to change and the transistor changes in behavior from A to B where the conduction properties change and have a superior transition region.

FIG. 24: Device similar to FIG. 23 but the transition occurs without the connection between the gate and the PTM region. The field caused by the gate causes PTM region to change and the transistor changes in behavior from A to B where the conduction properties change and have a superior transition region.

The underlying principle of the device structure is: (a) an ability to bring about phase transition in the material without passing current through it, e.g., through temperatures or fields; (b) coupling the effect of this phase transition in its material properties, e.g., through permittivity or conductivity, to the electrostatic coupling strength between gate and channel of a transistor; (c) sensing of the state through the conduction properties of a transistor, similar to what can be done for charge injection based floating gate memories; (d) writing to the structure through phenomena other than those based on power dissipation by passing current through the phase transition material, e.g., by temperature change arising due to power dissipation in the conducting channel; (e) erasing the structure by reversing the effect, e.g., in a crystalline-amorphous phase transition by the rate at which rise in temperature or quenching takes place.

Accordingly, there is set forth herein a method comprising providing a structure having an electrode and a phase transition material region; imparting energy to the phase transition material region to induce a phase transition of the phase transition material region from a first phase to a second phase, wherein the phase transition from the first phase to the second phase does not depend on charge transport through the phase transition material region, and wherein the phase transition of the phase transition material region results in a state change of the structure; and sensing the state of the structure.

There is accordingly further set forth herein an apparatus comprising a structure including an electrode and a phase transition material region, wherein the apparatus is operative for imparting energy to the phase transition material region to induce a phase transition of the phase transition material region without the phase transition of the phase transition material region being dependent on charge transport through the phase transition material region.

FIGS. 18 through 24 give examples of the cross-section or perspective view of the structure. The phase transition region can be coupled to the gate or decoupled to gate. In the most general form, the structure has two insulators present. However, these can be forms of the structures where either or both of the insulators that decouple the PTM region may be absent.

There is set forth herein (1) a structure where phase transition is employed without passing current through the phase transition material. There is also set forth herein (2) a structure where phase transition is employed in floating gate but little or no charge injection is employed for controlling the behavior of the device. The behavior of the device is dominated by the phase transition induced materials property change. There is also set forth herein (3) structures of 1 and 2 where the phase transition material changes its material properties in response to applied biases and/or current transport through the channel There is also set forth herein (4) structures for 1-4 for all materials that undergo phase transitions. There is also set forth herein (5) a structure where the phase transition floating gate region is connected to the control gate. There is also set forth herein (6) a structure where the phase transition floating gate region is not connected to the control gate. There is also set forth herein (7) a structure where two stable or quasi-stable states are achieved by inducing phase transition in the phase transition material. There is also set forth herein (8) a structure where during the turn-on of the conduction between the source and the drain, devices goes between two phase transition states, thus exhibiting a rapid change in onset of conduction. There is also set forth herein (9) a structure which behaves as a memory structure due to the change in phase properties of the floating gate region. There is also set forth herein (10) a structure which behaves as a memory structure due to change in phase properties of the floating gate region due to temperature change. There is also set forth herein (11) a structure which behaves as a memory structure due to change in phase properties of the floating gate region due to electric field change. There is also set forth herein (12) a structure which behaves as a memory structure due to phase change brought about due to atomic rearrangement without passing of current through the material region. There is also set forth herein (13) a structure which behaves as a memory structure due to phase change brought about due to electronic interactions. There is also set forth herein (14) a structure where the phase transition material is of a chalcogenide, GeSb, GeSbTe, GeSb with In, and other combinations classified as chalcogenides. There is also set forth herein (15) a structure where the phase transition region is a simple oxide that exhibits phase transition, Vanadium oxides, Chromium oxides, Nickel oxides, and others. There is also set forth herein (16) a structure where the phase transition region is a complex oxide that exhibits phase transition, LaSTO, LaCuO, STO, Copper Oxides, . . . , and other oxides that exhibit phase transition under field. There is also set forth herein (17) a structure where the channel conduction (in the presence of phase transition material) occurs through electrons. There is also set forth herein (18) a structure where the channel conduction (in the presence of phase transition material) occurs through holes. There is also set forth herein (19) a structure where the channel consists of a semiconductor, Si, Ge, SiGe, or compound semiconductor such as GaAs, InAs, InP, GaInAs, InSb. There is also set forth herein (20) a structure where the phase transition region is surrounded by insulators where the insulators include $SiO_2$, $Si_3N_4$, $Al_2O_3$, $HfO_2$, other high permittivity materials, and crystalline materials exhibiting insulating properties. There is also set forth herein (21) a structure where the semiconducting region may be made from organic materials.

A small sample of systems methods and apparatus that are described herein is as follows:

A1. A method comprising:
 providing a structure having a gate and a channel, wherein the providing includes providing a phase transition material region disposed between the gate and the channel;
 imparting energy to the phase transition material region to induce a phase transition of the phase transition material region.

A2. The method of A1, wherein the imparting energy includes applying heat.

A3. The method of A1, wherein the imparting energy includes applying a field.

A4. The method of A1, wherein the imparting energy includes applying heat without passing current through the phase transition material region.

A5. The method of A1, wherein the imparting energy results in a change of a conductivity of the phase transition material region.

A6. The method of A1, wherein the imparting energy results in a state change of the semiconductor structure, and wherein the method includes sensing a state of the semiconductor structure.

A7. The method of 6, wherein the providing includes providing an insulator between the gate and the channel A8. The method of A1, wherein the imparting energy includes changing a state of the phase transition material region, and wherein the method includes sensing a state of the semiconductor structure.

A9. The method of A1, wherein the providing includes providing the structure to include a source and drain, and wherein the imparting energy includes applying a positive voltage between the gate and the drain.

A10. The method of A1, wherein the providing includes providing the structure to include a source and drain, and wherein the imparting energy includes applying a negative voltage between the gate and the drain.

A11. The method of A1, wherein the providing includes providing the structure to include a source and drain, and wherein the imparting energy includes controlling a speed of decay of a voltage applied to the drain.

B1. A method comprising:
 providing a structure having an electrode and a phase transition material region;
 imparting energy to the phase transition material region to induce a phase transition of the phase transition material region from a first phase to a second phase, wherein the phase transition from the first phase to the second phase does not depend on charge transport through the phase transition material region, and wherein the phase transition of the phase transition material region results in a state change of the structure; and
 sensing the state of the structure.

B2. The method of B1, wherein the sensing includes sensing a conductivity of the structure.
B3. The method of B1, wherein the providing includes providing the structure to include a channel.
B4. The method of B1, wherein the providing includes providing the structure to include a gate, a source, a drain, and a channel
B5. The method of B1, wherein the imparting energy includes applying heat to the phase transition material region.
B6. The method of B1, wherein the imparting energy includes applying an electric field to the phase transition material region.
B7. The method of B1, wherein the imparting energy includes inducing charge transport through a channel in proximity with the phase transition material region.
B8. The method of B1, wherein the imparting energy includes applying an electric field to the phase transition material region and inducing charge transport through a channel in proximity with the phase transition material region for applying heat to the phase transition material region.
B9. The method of B1, wherein the imparting energy includes imparting energy in such manner that the phase transition of the phase transition material region does not depend on application of heat to the phase transition material region.
B10. The method of B1, wherein the imparting energy includes applying an electric field and applying heat to the phase transition material region.
B11. The method of B1, wherein the imparting energy includes inducing charge transport through a channel in proximity with the phase transition material region.
B12. The method of B1, wherein the imparting energy is carried out without inducing charge transport through the phase transition material region.
B13. The method of B1, wherein the method further includes imparting energy to the phase transition material region to induce a return transition of the phase transition material region to the first phase.
B14. The method of B1, wherein the providing includes providing the phase transition material region to include an oxide.
B15. The method of B1, wherein the providing includes providing the phase transition material region to include Vanadium oxide.
B16. The method of B1, wherein the providing includes providing the phase transition material region to include a complex oxide.
B17. The method of B1, wherein the providing includes providing the phase transition material region to include a chalcogenide.
B18. The method of B1, wherein the providing includes providing the phase transition material region to include GeSbTe.
C1. An apparatus comprising:
a structure including an electrode and a phase transition material region,
wherein the apparatus is operative for imparting energy to the phase transition material region to induce a phase transition of the phase transition material region without the phase transition of the phase transition material region being dependent on charge transport through the phase transition material region.
C2. The apparatus of C1, wherein the apparatus is operative for imparting energy to the phase transition material region without inducement of charge transport through the phase transition material region.
C3. The apparatus of C1, wherein the structure includes a plurality of electrodes, and wherein the plurality of electrodes are provided by a gate, a source, and a drain.
C4. The apparatus of C1, wherein the apparatus is operative to apply a voltage to the electrode for inducing a phase transition of the phase transition material region.
C5. The apparatus of C1, wherein the electrode is provided by a gate, and wherein the structure includes additional electrodes provided by a source and a drain which define a channel therebetween, and wherein the phase transition material region is disposed between the gate and the channel
C6. The apparatus of C1, wherein the electrode is provided by a gate, and wherein the structure includes additional electrodes provided by a source and a drain which define a channel therebetween, wherein the phase transition material region is disposed between the gate and the channel, and wherein there is further disposed between the gate and channel at least one insulator.
C7. The apparatus of C1, wherein the phase transition material region comprises an oxide.
C8. The apparatus of C1, wherein the phase transition material region comprises a simple oxide.
C9. The apparatus of C1, wherein the phase transition material region comprises a complex oxide.
C10. The apparatus of C1, wherein the phase transition material region comprises a simple oxide selective from the group consisting of Vanadium oxide, Chromium oxide, Nickel oxide.
C11. The apparatus of C1, wherein the phase transition material region comprises a complex oxide selective from the group consisting of LaSTO, LaCuO, STO, Copper oxide.
C12. The apparatus of C1, wherein the phase transition material region comprises a chalcogenide.
C13. The apparatus of C1, wherein the phase transition material region comprises a chalcogenide selected from the group consisting of GeSb, GeSbTe, GeSb with In.
C14. The apparatus of C1, wherein the phase transition material region comprises Vanadium oxide.
C15. The apparatus of C1, wherein the phase transition material region comprises GeSbTe.

While the present invention has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than or greater than the mentioned certain number of elements. Also, while a number of particular embodiments have been described, it will be understood that features and aspects that have been described with reference to each particular embodiment can be used with each remaining particularly described embodiment.

What is claimed is:
1. A method comprising:
providing a structure having a gate and a channel, wherein the providing includes providing a phase transition material region disposed between the gate and the channel;
imparting energy to the phase transition material region to induce a phase transition of the phase transition material region, wherein the imparting energy includes applying a field, wherein the imparting energy is performed without passing current by charge injection through the phase transition material region, and wherein charge is not transported to the phase transition material.

2. The method of claim 1, wherein the imparting energy includes applying heat.

3. The method of claim 1, wherein the imparting energy includes applying heat without passing current through the phase transition material region.

4. The method of claim 1, wherein the imparting energy results in a change of a conductivity of the phase transition material region.

5. The method of claim 1, wherein the imparting energy results in a state change of the structure, and wherein the method includes sensing a state of the structure.

6. The method of claim 5, wherein the providing includes providing an insulator between the gate and the channel.

7. The method of claim 1, wherein the imparting energy includes changing a state of the phase transition material region, and wherein the method includes sensing a state of the structure.

8. The method of claim 1, wherein the providing includes providing the structure to include a source and drain, and wherein the imparting energy includes applying a positive voltage between the gate and the drain.

9. The method of claim 1, wherein the providing includes providing the structure to include a source and drain, and wherein the imparting energy includes applying a negative voltage between the gate and the drain.

10. The method of claim 1, wherein the providing includes providing the structure to include a source and drain, and wherein the imparting energy includes controlling a speed of decay of a voltage applied to the drain.

11. A method comprising:
providing a structure having an electrode a gate and a channel and a phase transition material region disposed between the gate and the channel;
imparting energy to the phase transition material region to induce a phase transition of the phase transition material region from a first phase to a second phase, wherein the imparting energy includes applying an electric field to the phase transition material region,
wherein the phase transition from the first phase to the second phase does not depend on charge transport through the phase transition material region and wherein charge is not transported to the phase transition material, and wherein the phase transition of the phase transition material region results in a state change of the structure; and sensing the state of the structure.

12. The method of claim 11, wherein the sensing includes sensing a conductivity of the structure.

13. The method of claim 11, wherein the providing includes providing the structure to include a channel.

14. The method of claim 11, wherein the providing includes providing the structure to include a source and a drain.

15. The method of claim 11, wherein the imparting energy includes applying heat to the phase transition material region.

16. The method of claim 11, wherein the imparting energy includes inducing charge transport through a channel in proximity with the phase transition material region.

17. The method of claim 11, wherein the imparting energy includes inducing charge transport through a channel in proximity with the phase transition material region for applying heat to the phase transition material region.

18. The method of claim 11, wherein the imparting energy includes imparting energy in such manner that the phase transition of the phase transition material region does not depend on application of heat to the phase transition material region.

19. The method of claim 11, wherein the imparting energy includes applying an electric field and applying heat to the phase transition material region.

20. The method of claim 11, wherein the imparting energy includes inducing charge transport through a channel in proximity with the phase transition material region.

21. The method of claim 11, wherein the imparting energy is carried out without inducing charge transport through the phase transition material region.

22. The method of claim 11, wherein the method further includes imparting energy to the phase transition material region to induce a return transition of the phase transition material region to the first phase.

23. The method of claim 11, wherein the providing includes providing the phase transition material region to include an oxide.

24. The method of claim 11, wherein the providing includes providing the phase transition material region to include Vanadium oxide.

25. The method of claim 11, wherein the providing includes providing the phase transition material region to include a complex oxide.

26. The method of claim 11, wherein the providing includes providing the phase transition material region to include a chalcogenide.

27. The method of claim 11, wherein the providing includes providing the phase transition material region to include GeSbTe.

28. An apparatus comprising:
a structure including a gate and a channel and a phase transition material region disposed between the gate and the channel, a first insulator between the phase transition material region and the channel and a second insulator layer between the gate and the phase transition material region,
wherein the apparatus is operative for imparting energy to the phase transition material region to induce a phase transition of the phase transition material region without the phase transition of the phase transition material region being dependent on charge transport through the phase transition material region, and wherein the imparting energy to the phase transition material region includes applying an electric field to the phase transition material region, and wherein charge is not transported to the phase transition material.

29. The apparatus of claim 28, wherein the apparatus is operative for imparting energy to the phase transition material region without inducement of charge transport through the phase transition material region.

30. The apparatus of claim 28 wherein the structure includes a plurality of electrodes, and wherein the plurality of electrodes are provided by the gate, a source, and a drain.

31. The apparatus of claim 28, wherein the apparatus is operative to apply a voltage to the structure for inducing a phase transition of the phase transition material region.

32. The apparatus of claim 28 wherein the structure includes additional electrodes provided by a source and a drain which define a channel therebetween, and wherein the phase transition material region is disposed between the gate and the channel.

33. The apparatus of claim 28, wherein the structure includes additional electrodes provided by a source and a drain which define a channel therebetween, wherein the phase transition material region is disposed between the gate and the channel, and wherein there'is further disposed between the gate and channel at least one insulator.

34. The apparatus of claim 28, wherein the phase transition material region comprises an oxide.

35. The apparatus of claim 28, wherein the phase transition material region comprises a simple oxide.

36. The apparatus of claim 28, wherein the phase transition material region comprises a complex oxide.

37. The apparatus of claim 28, wherein the phase transition material region comprises a simple oxide selected from the group consisting of Vanadium oxide, Chromium oxide, Nickel oxide.

38. The apparatus of claim 28, wherein the phase transition material region comprises a complex oxide selected from the group consisting of LaSTO, LaCuO, STO, Copper oxide.

39. The apparatus of claim 28, wherein the phase transition material region comprises a chalcogenide.

40. The apparatus of claim 28 wherein the phase transition material region comprises a chalcogenide selected from the group consisting of GeSb, GeSbTe, GeSb with In.

41. The apparatus of claim 28, wherein the phase transition material region comprises Vanadium oxide.

42. The apparatus of claim 28, wherein the phase transition material region comprises GeSbTe.

* * * * *